(12) United States Patent
Inagaki

(10) Patent No.: US 10,201,824 B2
(45) Date of Patent: Feb. 12, 2019

(54) SUBSTRATE PROCESSING APPARATUS AND SUBSTRATE PROCESSING METHOD

(71) Applicant: SCREEN Semiconductor Solutions Co., Ltd., Kyoto (JP)

(72) Inventor: Yukihiko Inagaki, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 15/394,997

(22) Filed: Dec. 30, 2016

(65) Prior Publication Data

US 2017/0106389 A1    Apr. 20, 2017

Related U.S. Application Data

(62) Division of application No. 14/084,067, filed on Nov. 19, 2013, now Pat. No. 9,566,598.

(30) Foreign Application Priority Data

Dec. 11, 2012 (JP) ................................ 2012-270506

(51) Int. Cl.
*H01L 21/677* (2006.01)
*B05B 13/02* (2006.01)
*H01L 21/67* (2006.01)

(52) U.S. Cl.
CPC .... *B05B 13/0221* (2013.01); *H01L 21/67178* (2013.01); *H01L 21/67184* (2013.01); *H01L 21/67742* (2013.01); *H01L 21/67745* (2013.01)

(58) Field of Classification Search
CPC ......... H01L 21/67178; H01L 21/67184; H01L 21/67745
See application file for complete search history.

(56) References Cited

U.S. PATENT DOCUMENTS

| 5,639,301 | A | 6/1997 | Sasada et al. |
| 6,168,667 | B1 | 1/2001 | Yoshioka ...................... 118/715 |

(Continued)

FOREIGN PATENT DOCUMENTS

| GB | 2 217 107 A | 10/1989 |
| JP | 1-241840 A | 9/1989 |

(Continued)

OTHER PUBLICATIONS

Notice of Reasons for Refusal dated May 31, 2016 for corresponding JP Application No. 2012-270506.

*Primary Examiner* — Mark C Hageman
(74) *Attorney, Agent, or Firm* — Ostrolenk Faber LLP

(57) ABSTRACT

One processing block is arranged between an indexer block and another processing block. One substrate is transported to a main transport mechanism in the one processing block by a main transport mechanism in the indexer block, transported to a first processing section and a thermal processing section by the main transport mechanism in the one processing block and processing is performed on the substrate. The substrate after the processing is transported to the main transport mechanism in the indexer block by the main transport mechanism in the one processing block. Another substrate is transported to a sub-transport mechanism in a sub-transport chamber by the main transport mechanism in the indexer block, and is transported to a main transport mechanism in another processing block by the sub-transport mechanism in the sub-transport chamber. The substrate is transported to the sub-transport mechanism in the sub-transport chamber by the main transport mechanism in another processing block, and is transported to the main transport mechanism in the indexer block by the sub-transport mechanism in the sub-transport chamber.

7 Claims, 17 Drawing Sheets

(56) References Cited

U.S. PATENT DOCUMENTS

| | | | |
|---|---|---|---|
| 6,377,329 B1 | 4/2002 | Takekuma | 355/27 |
| 6,576,873 B1 | 6/2003 | Choi et al. | 219/390 |
| 8,443,513 B2 | 5/2013 | Ishida | 29/771 |
| 9,147,591 B2 | 9/2015 | Kobayashi | |
| 2003/0045107 A1 | 3/2003 | Jeong | 438/692 |
| 2006/0024446 A1 | 2/2006 | Sugimoto et al. | 427/377 |
| 2007/0186850 A1 | 8/2007 | Matsuoka et al. | 118/719 |
| 2008/0166210 A1 | 7/2008 | Hudgens et al. | 414/288 |
| 2008/0241403 A1 | 10/2008 | Matsuoka et al. | 427/331 |
| 2010/0236587 A1 | 9/2010 | Hamada et al. | 134/133 |
| 2011/0014562 A1 | 1/2011 | Matsuoka et al. | 430/125.3 |
| 2011/0063588 A1 | 3/2011 | Kashiyama et al. | 355/27 |
| 2011/0078898 A1 | 4/2011 | Ishida et al. | 29/771 |
| 2013/0302115 A1 | 11/2013 | Wakabayashi | 414/217 |
| 2014/0106281 A1 | 4/2014 | Hamada et al. | 430/325 |

FOREIGN PATENT DOCUMENTS

| | | |
|---|---|---|
| JP | 08-8321 | 8/1996 |
| JP | 09-148240 A | 6/1997 |
| JP | 10-335220 A | 12/1998 |
| JP | 2000-331922 A | 11/2000 |
| JP | 2001-168020 A | 6/2001 |
| JP | 2002-246442 | 8/2002 |
| JP | 2005-203635 A | 7/2005 |
| JP | 3816792 | 8/2006 |
| JP | 2008-258208 A | 10/2008 |
| JP | 2010-219434 A | 9/2010 |
| JP | 2011-066049 | 3/2011 |
| JP | 2011-100970 A | 5/2011 |
| WO | WO 2012/133218 | 10/2012 |

SUBSTRATE PROCESSING APPARATUS AND SUBSTRATE PROCESSING METHOD

CROSS-REFERENCE TO RELATED APPLICATIONS

This application is a divisional of U.S. patent application Ser. No. 14/084,067, filed Nov. 19, 2013, which claims the benefit of Japanese Patent Application No. 2012-270506, filed Dec. 11, 2012, both incorporated herein by reference.

BACKGROUND OF THE INVENTION

Field of the Invention

The present invention relates to a substrate processing apparatus and a substrate processing method.

Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing (see JP 2011-66049 A, for example).

The substrate processing apparatus described in JP 2011-66049 A includes an indexer block and first and second processing blocks. The first and second processing blocks include first and second transport sections, respectively. The unprocessed substrate is transported from the indexer block to the first processing block by the first transport section. In the first processing block, first processing is performed on the substrate. Thereafter, the substrate is received and transferred to the second transport section by the first transport section, and is transported to the second processing block by the second transport section. In the second processing block, second processing is performed on the substrate.

BRIEF SUMMARY OF THE INVENTION

In the substrate processing apparatus described in JP 2011-66049 A, the first and second transport sections transport the above-mentioned substrates such that various types of processing are performed on the substrates. However, when processing different and independent from each other is performed in the first and second processing blocks using this substrate processing apparatus, throughput of the second processing block is restricted by throughput of the first processing block.

An object of the present invention is to provide a substrate processing apparatus and a substrate processing method in which throughput can be improved.

(1) According to one aspect of the present invention, a substrate processing apparatus includes first, second and third processing regions, and a sub-transport region, wherein the second processing region is arranged between the first processing region and the third processing region, the first processing region includes a first main transport mechanism that transports a substrate, the second processing region includes a first processing section that performs processing on the substrate and a second main transport mechanism that transports the substrate, the third processing region includes a third main transport mechanism that transports the substrate, the sub-transport region includes a sub-transport mechanism that transports the substrate, the second main transport mechanism is configured to transport the substrate between the first main transport mechanism and the first processing section, and the sub-transport mechanism is configured to transport the substrate from the first main transport mechanism to the third main transport mechanism and to transport the substrate from the third main transport mechanism to the first main transport mechanism.

In the substrate processing apparatus, the second processing region is arranged between the first processing region and the third processing region. The one substrate is transported to the second main transport mechanism in the second processing region by the first main transport mechanism in the first processing region, and is transported to the first processing section by the second main transport mechanism. The processing is performed on the substrate by the first processing section. The substrate after the processing is transported to the first main transport mechanism by the second main transport mechanism.

Further, another substrate is transported to the sub-transport mechanism in the sub-transport region by the first main transport mechanism in the first processing region, and is transported to the third main transport mechanism in the third processing region by the sub-transport mechanism. Further, the substrate is transported to the sub-transport mechanism in the sub-transport region by the third main transport mechanism in the third processing region, and is transported to the first main transport mechanism in the first processing region by the sub-transport mechanism.

This configuration enables the substrate to be transported between the first processing region and the third processing region without the use of the second main transport mechanism in the second processing region. Thus, the throughput in the first or third processing region can be prevented from being restricted by the throughput in the second processing region. Therefore, the throughput of the substrate processing apparatus can be improved.

(2) The third processing region may further include a second processing section that performs processing on the substrate, and the third main transport mechanism may be configured to transport the substrate between the sub-transport mechanism and the second processing section.

Such configuration enables independent processing to be concurrently performed on the respective substrates in the first processing section in the second processing region and in the second processing section in the third processing region. In this case, the second main transport mechanism and the third main transport mechanism can perform the same or similar transportation. Thus, control of the transportation of the substrate by the second and third main transport mechanisms can be prevented from being complicated. Therefore, software that controls the second and third main transport mechanisms can be simplified.

(3) The substrate processing apparatus may further include a first substrate platform on which the substrate that is transported between the first main transport mechanism and the sub-transport mechanism is temporarily placed, and a second substrate platform on which the substrate that is transported between the third main transport mechanism and the sub-transport mechanism is temporarily placed.

In this case, the substrate is transported between the first main transport mechanism and the sub-transport mechanism via the first substrate platform. Further, the substrate is transported between the sub-transport mechanism and the third main transport mechanism via the second substrate platform. Thus, even when the transport speeds of the first main transport mechanism and the sub-transport mechanism are different, the substrate can be reliably transported between the first main transport mechanism and the sub-transport mechanism. Further, even when the transport speeds of the sub-transport mechanism and the third main transport mechanism are different, the substrate can be reliably transported between the sub-transport mechanism and the third main transport mechanism.

(4) The first processing section may include a first liquid processing unit that performs processing using a processing liquid on the substrate and a first thermal processing unit that performs thermal processing on the substrate, the second processing section may include a second liquid processing unit that performs processing using a processing liquid on the substrate and a second thermal processing unit that performs thermal processing on the substrate, the second processing region may include a first liquid processing region in which the first liquid processing unit is arranged, a first thermal processing region in which the first thermal processing unit is arranged and a first main transport region in which the second main transport mechanism is arranged, the third processing region may include a second liquid processing region in which the second liquid processing unit is arranged, a second thermal processing region in which the second thermal processing unit is arranged and a second main transport region in which the third main transport mechanism is arranged, the first and second liquid processing regions may be arranged to be adjacent to each other in a first direction, the first and second thermal processing regions may be arranged to be adjacent to each other in the first direction and the first and second main transport regions may be arranged to be adjacent to each other in the first direction, the first main transport region may be arranged between the first liquid processing region and the first thermal processing region in a second direction that intersects the first direction, and the second main transport region may be arranged between the second liquid processing region and the second thermal processing region in the second direction, the sub-transport region may be provided to extend in the first direction on an opposite side to the first and second main transport regions with respect to the first and second thermal processing regions, and the first substrate platform may be arranged between the first main transport region and the sub-transport region, and the second substrate platform may be arranged between the second main transport region and the sub-transport region.

In this case, with a simple configuration, the substrate is transported to the first liquid processing unit in the first liquid processing region and is transported to the first thermal processing unit in the first thermal processing region by the second main transport mechanism in the first main transport region.

Further, with a simple configuration, the substrate is transported between the first main transport mechanism and the sub-transport mechanism via the first substrate platform, and is transported between the sub-transport mechanism and the third main transport mechanism in the second main transport region via the second substrate platform. Further, with a simple configuration, the substrate is transported to the second liquid processing unit in the second liquid processing region and is transported to the second thermal processing unit in the second thermal processing region by the third main transport mechanism.

Thus, the liquid processing and the thermal processing can be independently and concurrently performed on the respective substrates in the second processing region and the third processing region. Therefore, it is possible to improve the throughput of the substrate processing apparatus without complicating the configuration and the control of the substrate processing apparatus.

(5) The first processing section may include a first lower processing section, and a first upper processing section arranged above the first lower processing section, the second main transport mechanism may include a first lower main transport mechanism that carries in the substrate from and carries out the substrate to the first lower processing section, and a first upper main transport mechanism arranged above the first lower main transport mechanism and carries in the substrate from and carries out substrate to the first upper processing section, the second processing section may include a second lower processing section, and a second upper processing section arranged above the second lower processing section, the third main transport mechanism may include a second lower main transport mechanism that carries in the substrate from and carries out the substrate to the second lower processing section, and a second upper main transport mechanism arranged above the second lower main transport mechanism and carries in the substrate from and carries out the substrate to the second upper processing section, the sub-transport mechanism may include a first sub-transport mechanism configured to transport the substrate from the first main transport mechanism to the second lower main transport mechanism and to transport the substrate from the second lower main transport mechanism to the first main transport mechanism, and a second sub-transport mechanism configured to transport the substrate from the first main transport mechanism to the second upper main transport mechanism and to transport the substrate from the second upper main transport mechanism to the first main transport mechanism, the first sub-transport mechanism may be configured to be capable of transporting the substrate from the first main transport mechanism to the second upper main transport mechanism, and to be capable of transporting the substrate from the second upper main transport mechanism to the first main transport mechanism, and the second sub-transport mechanism may be configured to be capable of transporting the substrate from the first main transport mechanism to the second lower main transport mechanism, and to be capable of transporting the substrate from the second lower main transport mechanism to the first main transport mechanism.

In this case, the substrate is carried into the first lower processing section and the substrate is carried out from the first lower processing section by the first lower main transport mechanism in the second processing region. Further, the substrate is carried into the first upper processing section and the substrate is carried out from the first upper processing section by the first upper main transport mechanism in the second processing region. Further, the substrate is transported from the first processing region to the second lower main transport mechanism by the first sub-transport mechanism, and the substrate is carried into the second lower processing section by the second lower main transport mechanism in the third processing region. Further, the substrate is carried out from the second lower processing section by the second lower main transport mechanism in the third processing region, and the substrate is transported to the first processing region by the first sub-transport mechanism. Thus, the processing can be concurrently performed on a large number of substrates.

Further, the first sub-transport mechanism can transport the substrate from the first main transport mechanism to the second upper main transport mechanism, and can transport the substrate from the second upper main transport mechanism to the first main transport mechanism. Thus, even when an abnormality occurs in the second sub-transport mechanism, transportation of the substrate between the first main transport mechanism and the second upper main transport mechanism can be performed. Further, even when an abnormality occurs in the second lower processing section or the second lower main transport mechanism, the transportation of the substrate between the first main transport mechanism and the second upper main transport mechanism is performed, whereby the processing for the substrate can be continued.

Further, the second sub-transport mechanism can transport the substrate from the first main transport mechanism to the second lower main transport mechanism, and can transport the substrate from the second lower main transport mechanism to the first main transport mechanism. Thus, even when an abnormality occurs in the first sub-transport mechanism, transportation of the substrate between the first main transport mechanism and the second lower main transport mechanism can be performed. Further, even when an abnormality occurs in the second upper processing section or the second upper main transport mechanism, the transportation of the substrate between the first main transport mechanism and the second lower main transport mechanism is performed, whereby the processing for the substrate can be continued.

(6) The first processing section in the second processing region and the second processing section in the third processing region may alternately perform same processing on the substrate.

In this case, the second and third main transport mechanisms can be controlled by the same software. Thus, the software that controls the second and third main transport mechanisms can be simplified.

(7) A substrate processing apparatus according to another aspect of the present invention, a substrate processing apparatus includes first, second and third processing regions, and a sub-transport region, wherein the second processing region is arranged between the first processing region and the third processing region, the first processing region includes a first main transport mechanism that transports a substrate, the second processing region includes a processing section that performs processing on the substrate and a second main transport mechanism that transports the substrate, the processing section includes a plurality of processing units, the third processing region includes a third main transport mechanism that transports the substrate, the sub-transport region includes a sub-transport mechanism that transports the substrate, the sub-transport mechanism is configured to transport the substrate between the first main transport mechanism and at least one processing unit of the plurality of processing units, and the second main transport mechanism is configured to carry in the substrate from and carry out the substrate to another processing unit of the plurality of processing units, to receive the substrate from and transfer the substrate to the first main transport mechanism and to receive the substrate from and transfer the substrate to the third main transport mechanism.

In this substrate processing apparatus, the second processing region is arranged between the first processing region and the third processing region. The substrate is transported to the sub-transport mechanism in the sub-transport region by the first main transport mechanism in the first processing region, and is transported to at least the one processing unit of the plurality of processing units in the processing section in the second processing region by the sub-transport mechanism. The one processing is performed on the substrate by the one processing unit.

The substrate after the one processing is carried into another processing unit of the plurality of processing units by the second main transport mechanism. Another processing is performed on the substrate by another processing unit. The substrate after another processing is carried out from another processing unit by the second main transport mechanism, and received and transferred to the third main transport mechanism in the third processing region. Further, the substrate is received and transferred to the second main transport mechanism by the third main transport mechanism, and received and transferred to the first main transport mechanism by the second main transport mechanism.

In this case, transportation of the substrate to at least the one processing unit of the plurality of processing units in the processing section in the second processing region is performed by the sub-transport mechanism. Therefore, the number of transportation steps by the second main transport mechanism is reduced. Thus, a burden on the second main transport mechanism can be reduced. As a result, the throughput of the substrate processing apparatus can be improved.

(8) The substrate processing apparatus may further include a first substrate platform on which the substrate that is transported between the first main transport mechanism and the sub-transport mechanism is temporarily placed and the substrate that is transported between the sub-transport mechanism and the second main transport mechanism is temporarily placed.

In this case, the substrate is transported between the first main transport mechanism and the sub-transport mechanism via the first substrate platform. Further, the substrate is transported between the sub-transport mechanism and the second main transport mechanism via the first substrate platform. Thus, even when the transport speeds of the first main transport mechanism and the sub-transport mechanism are different, the substrate can be reliably transported between the first main transport mechanism and the sub-transport mechanism. Further, even when the transport speeds of the sub-transport mechanism and the second main transport mechanism are different, the substrate can be reliably transported between the sub-transport mechanism and the second main transport mechanism.

(9) The plurality of processing units may include a liquid processing unit that performs processing using a processing liquid and a thermal processing unit that performs thermal processing on the substrate, the at least one processing unit may include the thermal processing unit, the second processing region may include a liquid processing region in which the liquid processing unit is arranged, a thermal processing region in which the thermal processing unit is arranged and a main transport region in which the second main transport mechanism is arranged, the main transport region may be arranged between the liquid processing region and the thermal processing region, the sub-transport region may be provided on an opposite side to the main transport region with respect to the thermal processing region, and the first substrate platform may be arranged between the main transport region and the sub-transport region.

In this case, with a simple configuration, the substrate is transported to the first liquid processing region and the thermal processing region by the second main transport mechanism in the main transport region. Thus, the thermal processing can be performed on the substrate as the one processing. Further, the processing using the processing liquid and the thermal processing can be performed on the substrate as another processing.

(10) The substrate processing apparatus may further include a second substrate platform on which the substrate that is received and transferred between the first main transport mechanism and the second main transport mechanism is temporarily placed, and a third substrate platform on which the substrate that is transported between the second main transport mechanism and the third main transport mechanism is temporarily placed.

In this case, the substrate is transported between the first main transport mechanism and the second main transport mechanism via the second substrate platform. Further, the substrate is transported between the second main transport mechanism and the third main transport mechanism via the third substrate platform. Thus, even when the transport speeds of the first main transport mechanism and the second main transport mechanism are different, the substrate can be reliably transported between the first main transport mechanism and the second main transport mechanism. Further, even when the transport speeds of the second main transport mechanism and the third main transport mechanism are different, the substrate can be reliably transported between the second main transport mechanism and the third main transport mechanism.

(11) The first processing region may further include a container platform on which a substrate storing container that stores the substrate is placed, and the first main transport mechanism may be configured to transport the substrate between the substrate storing container placed on the container platform and the second main transport mechanism and to transport the substrate between the substrate storing container placed on the container platform and the sub-transport mechanism.

In this case, the substrate stored in the substrate storing container on the container platform are sequentially transported to the second main transport mechanism or the sub-transport mechanism by the first main transport mechanism. Further, the substrate that is transported to the first main transport mechanism by the second main transport mechanism or the sub-transport mechanism are sequentially stored in the substrate storing container on the container platform. Thus, the processing can be efficiently performed on the plurality of substrates.

(12) The substrate processing apparatus may further include a fourth processing region arranged to be adjacent to the third processing region, wherein the fourth processing region may include a fourth main transport mechanism that transports the substrate, and the third main transport mechanism may be configured to transport the substrate among the sub-transport mechanism, the second processing section and the fourth main transport mechanism.

In this case, the substrate can be transported among the sub-transport mechanism, the second processing section and the fourth main transport mechanism by the third main transport mechanism.

(13) According to still another aspect of the present invention, a substrate processing method using a substrate processing apparatus that includes first, second and third processing regions and a sub-transport region, the second processing region being arranged between the first processing region and the third processing region, includes the steps of transporting a substrate by a first main transport mechanism arranged in the first processing region, transporting the substrate between the first main transport mechanism and a processing section in the second processing region by a second main transport mechanism arranged in the second processing region, performing processing on the substrate by the processing section, transporting the substrate by a third main transport mechanism arranged in the third processing region, transporting the substrate from the first main transport mechanism to the third main transport mechanism by a sub-transport mechanism arranged in the sub-transport region, and transporting the substrate from the third main transport mechanism to the first main transport mechanism by the sub-transport mechanism.

In this substrate processing method, the second processing region is arranged between the first processing region and the third processing region. The one substrate is transported to the second main transport mechanism in the second processing region by the first main transport mechanism in the first processing region, and is transported to the processing section by the second main transport mechanism. The processing is performed on the substrate by the processing section. The substrate after the processing is transported to the first main transport mechanism by the second main transport mechanism.

Further, another substrate is transported to the sub-transport mechanism in the sub-transport region by the first main transport mechanism in the first processing region, and is transported to the third main transport mechanism in the third processing region by the sub-transport mechanism. Further, the substrate is transported to the sub-transport mechanism in the sub-transport region by the third main transport mechanism in the third processing region, and is transported to the first main transport mechanism in the first processing region by the sub-transport mechanism.

This configuration enables the substrate to be transported between the first processing region and the third processing region without the use of the second main transport mechanism in the second processing region. Thus, the throughput in the first or third processing region can be prevented from being restricted by the throughput in the second processing region. Therefore, the throughput in the substrate processing apparatus can be improved.

(14) According to yet another aspect of the present invention, a substrate processing method using a substrate processing apparatus that includes first, second and third processing regions and a sub-transport region, the second processing region being arranged between the first processing region and the third processing region, includes the steps of transporting a substrate by a first main transport mechanism arranged in the first processing region, receiving the substrate from and transferring the substrate to the first main transport mechanism by a second main transport mechanism arranged in the second processing region, performing processing on the substrate by a plurality of processing units arranged in the second processing region, transporting the substrate between the first main transport mechanism and at least one processing unit of the plurality of processing units and transporting the substrate between the at least one processing unit and the second main transport mechanism by a sub-transport mechanism arranged in the sub-transport region, transporting the substrate between the sub-transport mechanism and another processing unit of the plurality of processing units by the second main transport mechanism, receiving the substrate from and transferring the substrate to the third main transport mechanism by the second main transport mechanism, and transporting the substrate by a third main transport mechanism arranged in the third processing region.

In this substrate processing method, the second processing region is arranged between the first processing region and the third processing region. The substrate is transported to the sub-transport mechanism in the sub-transport region by the first main transport mechanism in the first processing region, and is transported to at least the one processing unit of the plurality of the processing units in the processing section in the second processing region by the sub-transport mechanism. The one processing is performed on the substrate by the one processing unit.

The substrate after the one processing is carried into another processing unit of the plurality of processing units by the sub-transport mechanism and the second main transport mechanism. Another processing is performed on the substrate by another processing unit. The substrate after another processing is carried out from another processing unit by the second main-transport mechanism, and is received and transferred to the third main transport mechanism in the third processing region. Further, the substrate is received and transferred to the second main transport mechanism by the third main transport mechanism and is received and transferred to the first main transport mechanism by the second main transport mechanism.

In this case, the transportation of the substrate to at least the one processing unit of the plurality of processing units in the processing section in the second processing region is performed by the sub-transport mechanism. Therefore, the number of transportation steps by the second main transport mechanism is reduced. Thus, a burden on the second main transport mechanism can be reduced. As a result, the throughput of the substrate processing apparatus can be improved.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus and a substrate processing method according to embodiments of the present invention will be described below with reference to the drawings. In the following description, a substrate refers to a semiconductor substrate, a substrate for a liquid crystal display, a substrate for a plasma display, a glass substrate for a photomask, a substrate for an optical disc, a substrate for a magnetic disc, a substrate for a magneto-optical disc, a substrate for a photomask or the like.

In the substrate used in the present embodiment, at least part of the substrate has a circular outer periphery. The outer periphery except for a cutout (an orientation flat or a notch) for positioning is circular, for example.

[1] First Embodiment
(1) Configuration of Substrate Processing Apparatus

Figure 1:
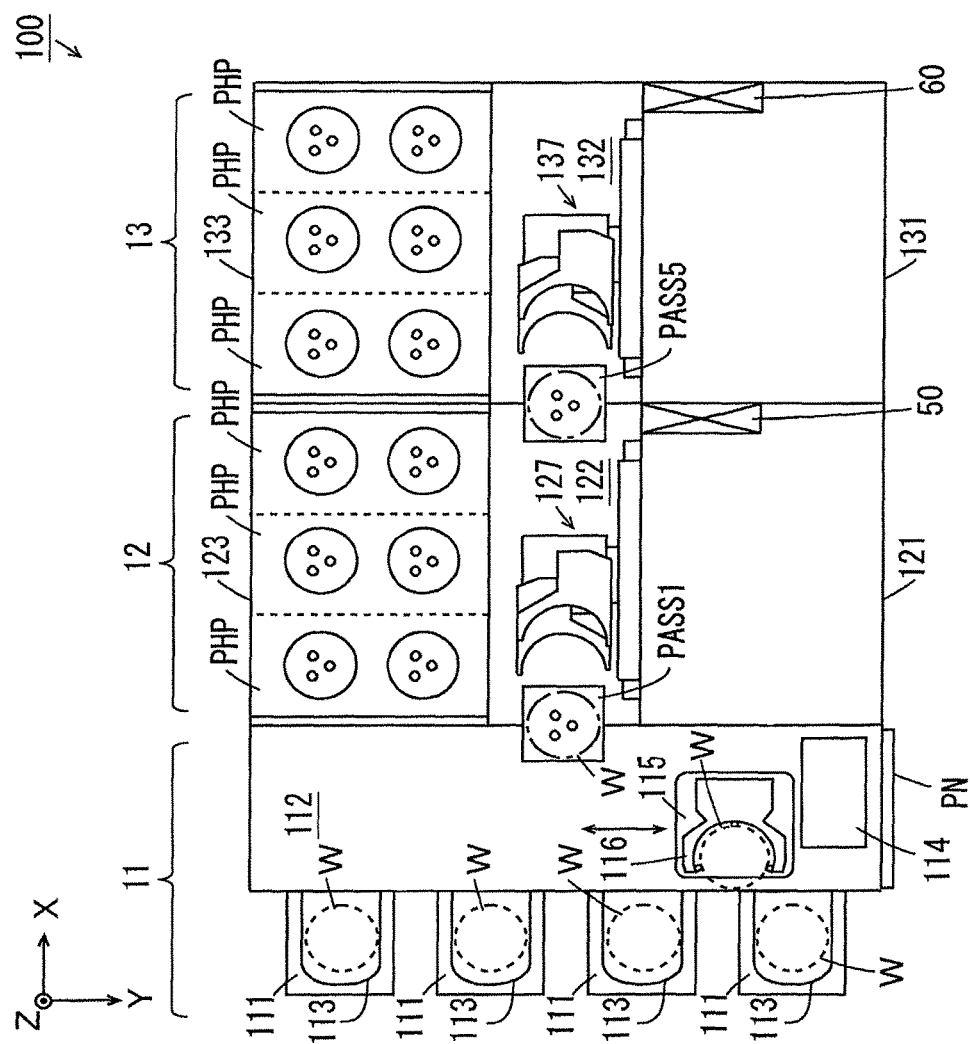
FIG. 1 is a schematic plan view of a substrate processing apparatus according to a first embodiment of the present invention.

FIG. 1 is a schematic plan view of the substrate processing apparatus according to the first embodiment of the present invention. FIG. 1 and subsequent given diagrams are accompanied by the arrows that indicate X, Y, and Z directions orthogonal to one another for the clarity of a positional relationship. The X and Y directions are orthogonal to each other within a horizontal plane, and the Z direction corresponds to a vertical direction. Note that the direction toward the arrow is defined as + direction, and the opposite direction thereto is defined as − direction.

As shown in FIG. 1, the substrate processing apparatus 100 includes an indexer block 11 and processing blocks 12, 13. The indexer block 11 includes a plurality of carrier platforms 111 and a transport section 112. A carrier 113 that stores a plurality of substrates W in multiple stages is placed in each carrier platform 111. While a FOUP (Front Opening Unified Pod) is used as the carrier 113 in the present embodiment, the present invention is not limited to this. A SMIF (Standard Mechanical Inter Face) pod, an OC (Open Cassette) that exposes the stored substrates W to the outside air or the like may be used.

A transport section 112 is provided with a main controller 114 and a main transport mechanism 115. The main controller 114 controls various constituent elements of the substrate processing apparatus 100. The main transport mechanism 115 has a hand 116 for holding the substrate W. The main transport mechanism 115 holds and transports the substrate W using the hand 116. Further, as shown in after-mentioned FIG. 5, an opening 119 for receiving and transferring the substrates W between each carrier 113 and the main transport mechanism 115 is formed at the transport section 112.

A main panel PN is provided on a side surface of the transport section 112. The main panel PN is connected to the main controller 114. A user can confirm the processing status of the substrate W in the substrate processing apparatus 100 and other information on the main panel PN. An operation unit (not shown) made of a keyboard, for example, is provided in the vicinity of the main panel PN. The user can set operation settings of the substrate processing apparatus 100 and so on by operating the operation unit.

The processing block 12 includes a first processing section 121, a transport section 122 and a thermal processing section 123. In the present embodiment, the first processing section 121 is a coating processing section. The first processing section 121 and the thermal processing section 123 are provided to be opposite to each other with the transport section 122 sandwiched therebetween. A substrate platform PASS1 and after-mentioned substrate platforms PASS2 to PASS4 (FIG. 5), on which the substrates W are to be placed, are provided between the transport section 122 and the indexer block 11. The transport section 122 is provided with a main transport mechanism 127 and an after-mentioned main transport mechanism 128 (FIG. 5) that transport the substrates W.

The processing block 13 includes a second processing section 131, a transport section 132 and a thermal processing section 133. In the present embodiment, the second processing section 131 is a coating processing section. The second processing section 131 and the thermal processing section 133 are provided to be opposite to each other with the transport section 132 sandwiched therebetween. A substrate platform PASS5 and after-mentioned substrate platforms PASS6 to PASS8 (FIG. 5), on which the substrates W are to be placed, are provided between the transport section 132 and the transport section 122. The transport section 132 is provided with a main transport mechanism 137 and an after-mentioned main transport mechanism 138 (FIG. 5) that transport substrates W.

(2) Configuration of First Processing Section and Second Processing Section

Figure 2:
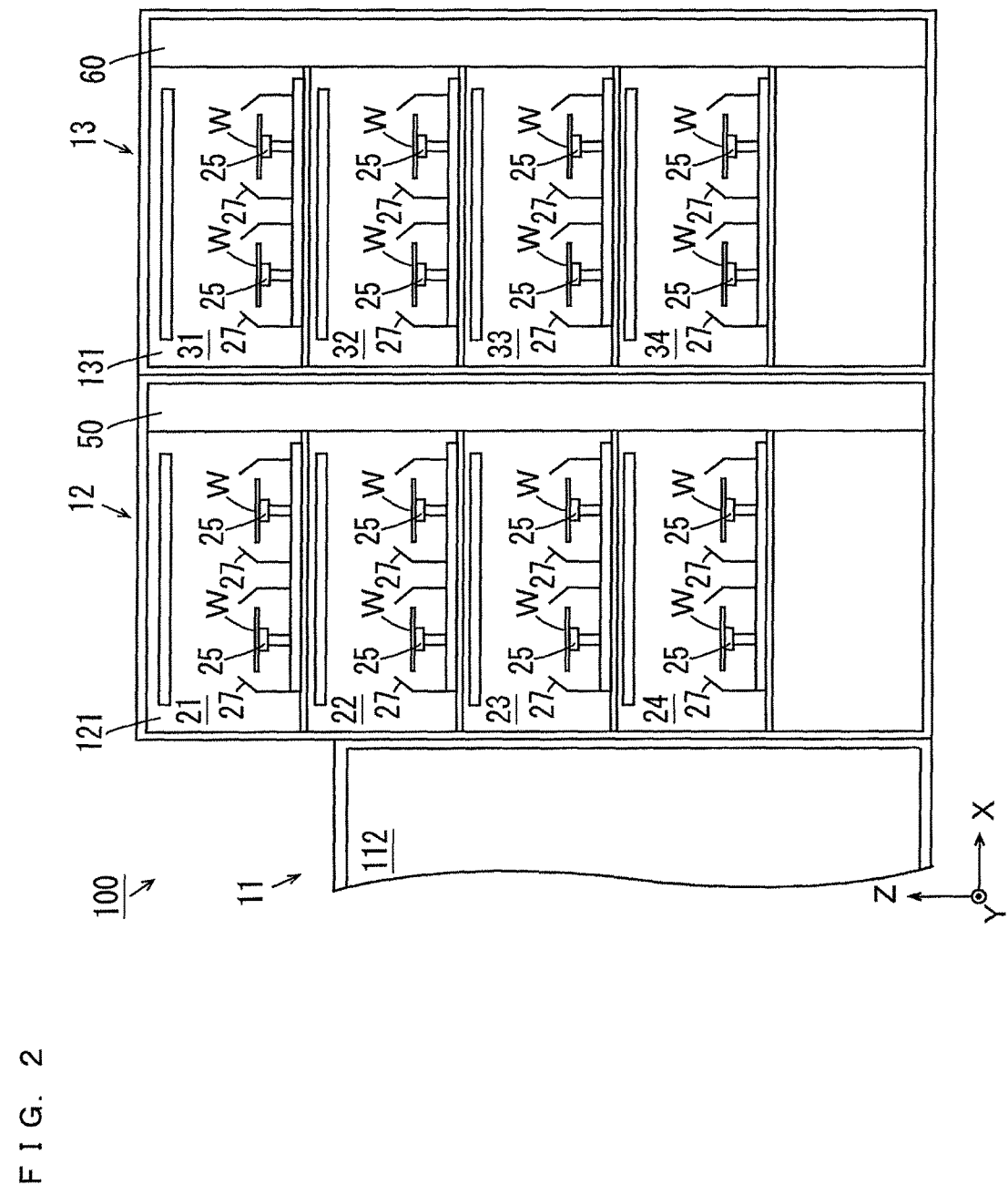
FIG. 2 is a diagram of a first processing section and a second processing section of FIG. 1 as viewed in the −Y direction.

FIG. 2 is a diagram of the first processing section 121 and the second processing section 131 of FIG. 1 as viewed in the −Y direction. As shown in FIG. 2, four processing chambers 21, 22, 23, 24 are provided in a stack in the first processing section 121. Four processing chambers 31, 32, 33, 34 are provided in a stack in the second processing section 131. In the present embodiment, the processing chambers 21 to 24, 31 to 34 are coating processing chambers.

A plurality of spin chucks 25, a plurality of cups 27 and a plurality of processing liquid nozzles (not shown) are provided in each processing chamber 21 to 24, 31 to 34. In the present embodiment, the two spin chucks 25 and the two cups 27 are provided in each processing chamber 21 to 24, 31 to 34.

When each spin shuck 25 is holding the substrate W, the spin chuck 25 is driven to be rotated by a driving device (an electric motor, for example) that is not shown. Each cup 27 is provided to surround the spin chuck 25. A processing liquid is supplied from a processing liquid storage (not shown) to each processing liquid nozzle through a processing liquid pipe. In the present embodiment, the processing liquid is a processing liquid for a resist film (a resist liquid). The processing liquid is discharged from the processing liquid nozzle when the spin chuck 25 is being rotated such that the processing liquid is applied on the rotating substrate W.

As shown in FIGS. 1 and 2, a fluid box 50 is provided in the first processing section 121 to be adjacent to the second processing section 131. A fluid box 60 is provided in the second processing section 131 to be opposite to the first processing section 121. The fluid box 50 and the fluid box 60 each store fluid related elements used to supply the processing liquid to the processing chambers 21 to 24, 31 to 34, and discharge the liquid and air out of the processing chambers 21 to 24, 31 to 34. The fluid related elements include pipes, joints, valves, flowmeters, regulators, pumps, temperature adjusters and the like.

(3) Configuration of Thermal Processing Section

Figure 3:
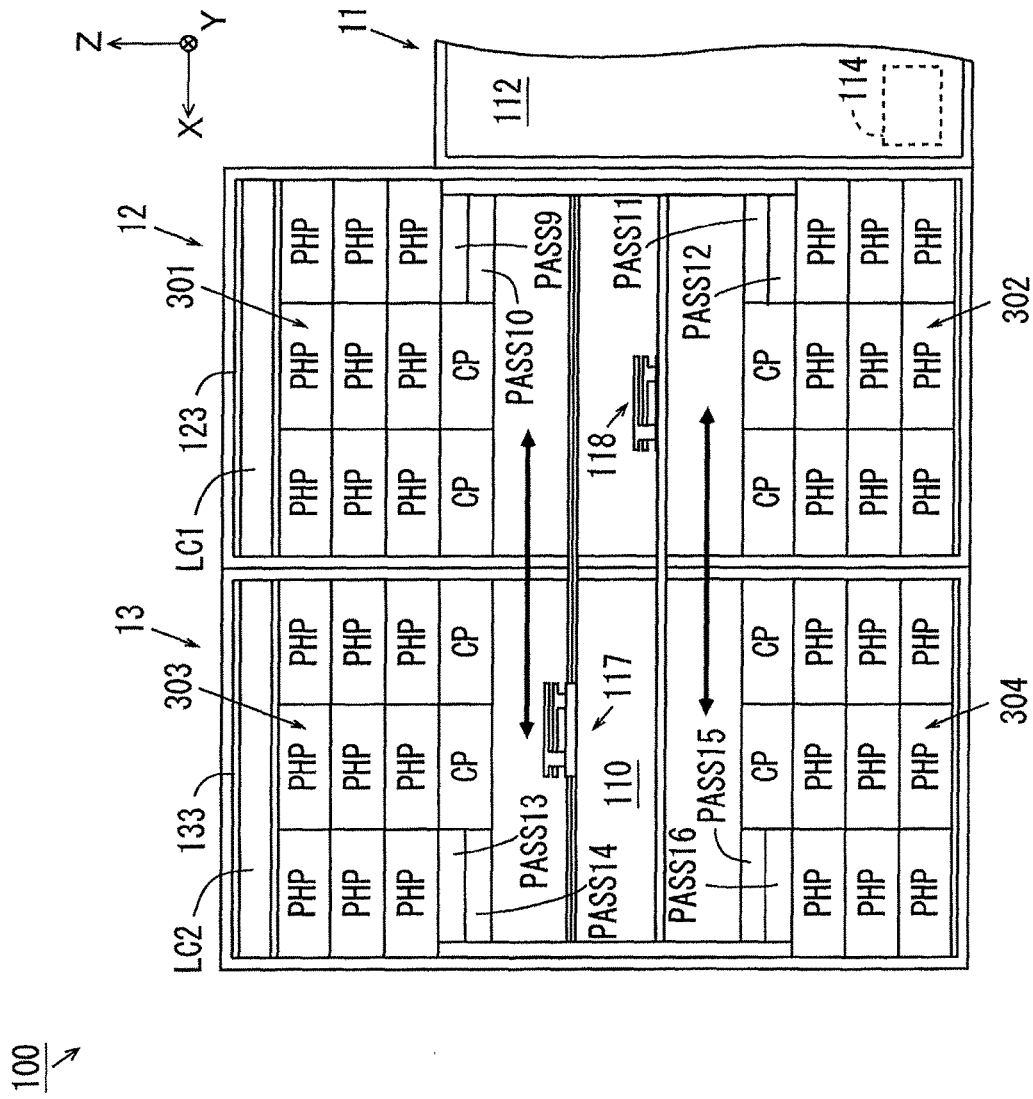
FIG. 3 is a diagram of a thermal processing section of FIG. 1 as viewed in the +Y direction.

FIG. 3 is a diagram of the thermal processing sections 123, 133 of FIG. 1 as viewed in the +Y direction. As shown in FIG. 3, the thermal processing section 123 has an upper thermal processing section 301 provided above, and a lower thermal processing section 302 provided below. In the present embodiment, the upper thermal processing section 301 is provided with a plurality of thermal processing units PHP, a plurality of cooling units CP and a plurality of substrate platforms PASS9, PASS10. The lower thermal processing section 302 is provided with a plurality of thermal processing units PHP, a plurality of cooling units CP and a plurality of substrate platforms PASS11, PASS12.

The substrate platforms PASS9, PASS10 and the cooling units CP are arranged at its lowermost portion of the upper thermal processing section 301, and the substrate platforms PASS11, PASS12 and the cooling units CP are arranged at its uppermost portion of the lower thermal processing section 302. In each thermal processing unit PHP, heating processing and cooling processing for the substrate W are performed. In each cooling unit CP, the cooling processing for the substrate W is performed.

A local controller LC1 is provided at its uppermost portion of the thermal processing section 123. The local controller LC1 performs temperature control of the thermal processing units PHP and the cooling units CP in the thermal processing section 123. Further, the local controller LC1 controls the operation of the spin chucks 25 of FIG. 2, the supply of the processing liquid to the processing liquid nozzles and the like. Further, the local controller LC1 controls the operation of the main transport mechanism 127 of FIG. 1.

The thermal processing section 133 has an upper thermal processing section 303 provided above, and a lower thermal processing section 304 provided below. In the present embodiment, the upper thermal processing section 303 is provided with a plurality of thermal processing units PHP, a plurality of cooling units CP and a plurality of substrate platforms PASS13, PASS14. The lower thermal processing section 304 is provided with a plurality of thermal processing units PHP, a plurality of cooling units CP and a plurality of substrate platforms PASS15, PASS16.

The substrate platforms PASS13, PASS14 and the cooling units CP are arranged at its lowermost portion of the upper thermal processing section 303, and the substrate platforms PASS15, PASS16 and the cooling units CP are arranged at its uppermost portion of the lower thermal processing section 304.

A local control LC2 is provided at its uppermost portion of the thermal processing section 133. The local controller LC2 performs the temperature control of the thermal processing units PHP and the cooling units CP in the thermal processing section 133. Further, the local controller LC2 controls the operation of the spin chucks 25 of FIG. 2 and the supply of the processing liquid to the processing liquid nozzles and the like. Further, the local controller LC2 controls the operation of the main transport mechanism 137 of FIG. 1.

A sub-transport chamber 110 is provided between the upper thermal processing sections 301, 303 and the lower thermal processing sections 302, 304. Two sub-transport mechanisms 117, 118 are provided in the sub-transport chamber 110. The sub-transport mechanisms 117, 118 are controlled by the main controller 114 in the indexer block 11. The configuration and the operation of the sub-transport mechanisms 117, 118 in the sub-transport chamber 110 will be described below.

The local controllers LC1, LC2 and the main controller 114 control each constituent element in accordance with a control program (control software).

(4) Configuration of Transport Sections

Figure 4:
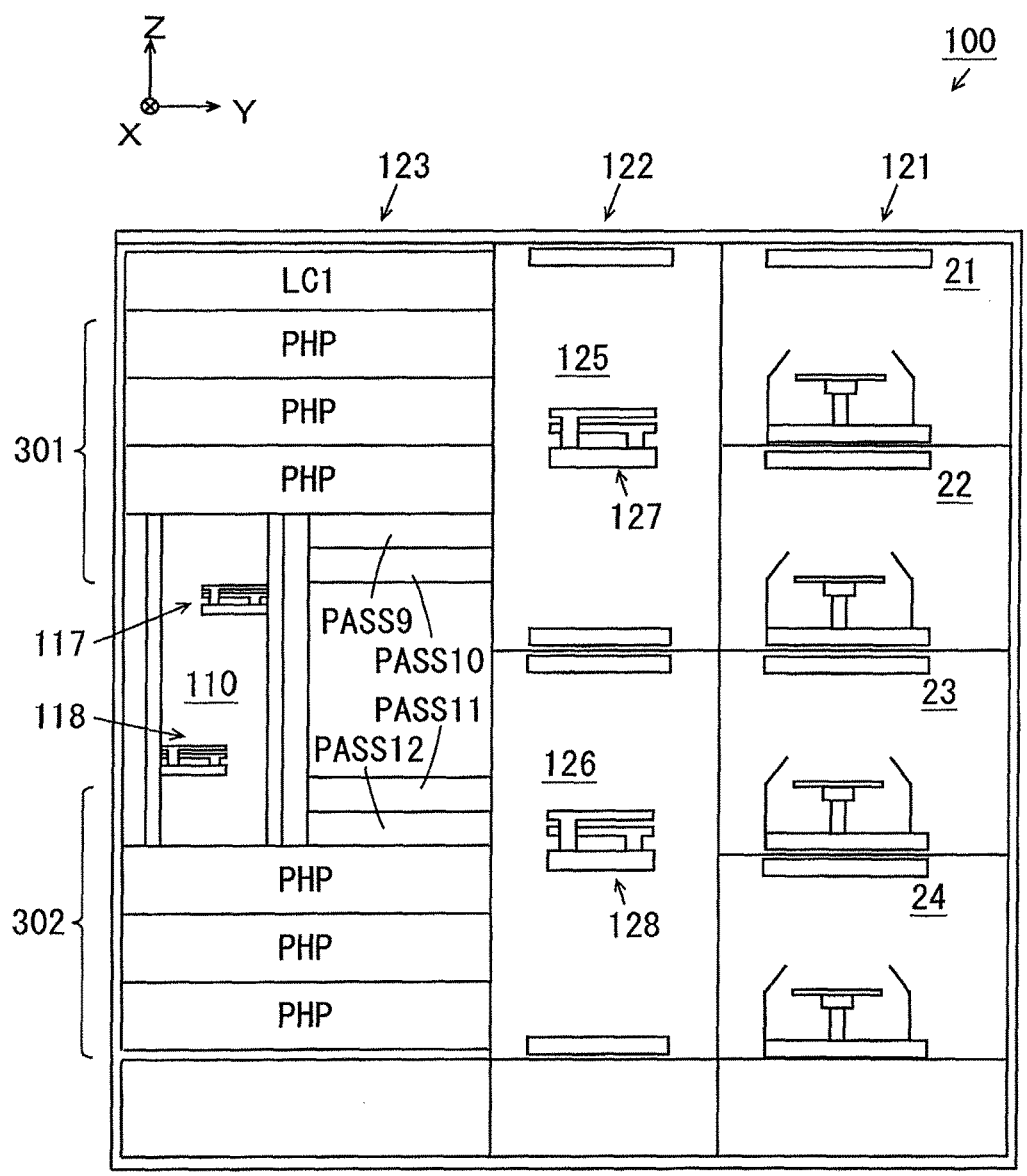
FIG. 4 is a diagram of the first processing section, a transport section and the thermal processing section of FIG. 1 as viewed in the +X direction.
Figure 5:
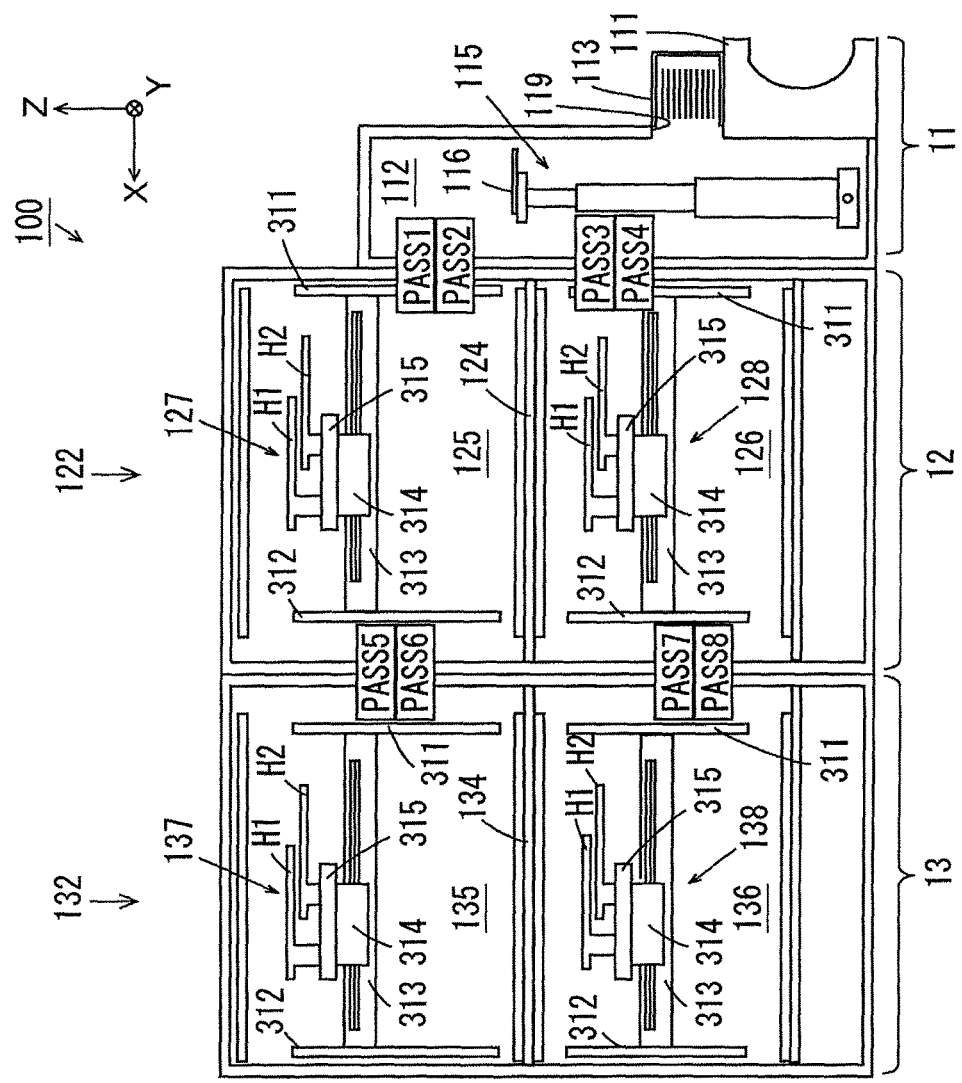
FIG. 5 is a diagram of the transport sections as viewed in the +Y direction.

FIG. 4 is a diagram of the first processing section 121, the transport section 122 and the thermal processing section 123 of FIG. 1 as viewed in the +X direction. FIG. 5 is a diagram of the transport sections 122, 132 as viewed in the +Y direction. As shown in FIGS. 4 and 5, the transport section 122 has an upper transport chamber 125 and a lower transport chamber 126. As shown in FIG. 5, the transport section 132 has an upper transport chamber 135 and a lower transport chamber 136.

The main transport mechanism 127 is provided in the upper transport chamber 125, and the main transport mechanism 128 is provided in the lower transport chamber 126. Further, the main transport chamber 137 is provided in the upper transport chamber 135, and the main transport mechanism 138 is provided in the lower transport chamber 136.

As shown in FIG. 4, the processing chambers 21, 22 and the upper thermal processing section 301 are provided to be opposite to each other with the upper transport chamber 125 sandwiched therebetween, and the processing chambers 23, 24 and the lower thermal processing section 302 are provided to be opposite to each other with the lower transport chamber 126 sandwiched therebetween. Similarly, the processing chambers 31, 32 (FIG. 2) and the upper thermal processing section 303 (FIG. 3) are provided to be opposite to each other with the upper transport chamber 135 (FIG. 5) sandwiched therebetween, and the processing chambers 33, 34 (FIG. 2) and the lower thermal processing section 304 (FIG. 3) are provided to be opposite to each other with the lower transport chamber 136 (FIG. 5) sandwiched therebetween.

As shown in FIG. 5, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and lower transport chamber 136. In the present embodiment, the substrate platforms PASS1 to PASS8 do not have to be used depending on a transport route of the substrate W.

The substrate W that is transported from the indexer block 11 to the processing block 12 can be placed on the substrate platform PASS1 and the substrate platform PASS3, and the substrate W that is transported from the processing block 12 to the indexer block 11 can be placed on the substrate platform PASS2 and the substrate platform PASS4. Further, the substrate W that is transported from the processing block 12 to the processing block 13 can be placed on the substrate platform PASS5 and the substrate platform PASS7, and the substrate W that is transported from the processing block 13 to the processing block 12 can be placed on the substrate platform PASS6 and the substrate platform PASS8.

(5) Configuration of Main Transport Mechanisms

Figure 6:
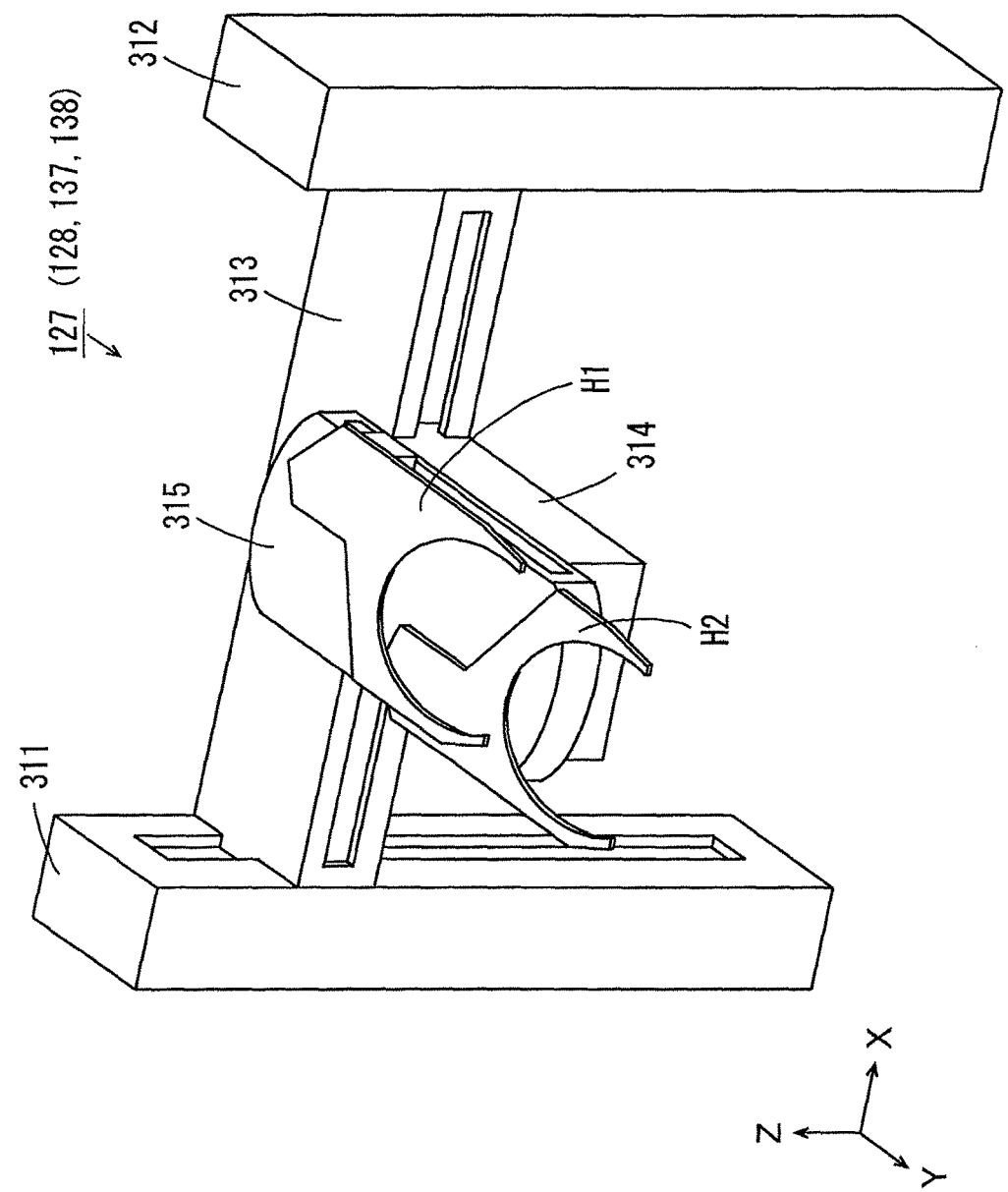
FIG. 6 is a perspective view showing a main transport mechanism.

Next, the main transport mechanisms 127, 128, 137, 138 will be described. FIG. 6 is a perspective view showing the main transport mechanism 127. As shown in FIG. 6, the main transport mechanism 127 includes long-sized guide rails 311, 312. As shown in FIG. 5, the guide rails 311, 312 are arranged to extend in the vertical direction (Z direction) and to be spaced apart from each other in the X direction in the upper transport chamber 125. The guide rail 311 is fixed at a position in close proximity to the side surface close to the transport section 112 in the X direction. The guide rail 312 is fixed at a position in close proximity to the side surface far from the transport section 112 in the X direction.

A long-sized guide rail 313 is provided to extend in a horizontal direction (X direction) between the guide rail 311 and the guide rail 312. The guide rail 313 is attached to the guide rails 311, 312 to be movable in the vertical direction. A moving member 314 is attached to the guide rail 313. The moving member 314 is provided to be movable in the X direction along the guide rail 313.

The rotation member 315 is provided at the upper surface of the moving member 314 to be rotatable around an axis in the Z direction. A hand H1 and a hand H2 for holding the substrates W are attached to the rotation member 315. The hands H1, H2 are provided to be capable of advancing and retreating with respect to the rotation member 315. The main transport mechanisms 128, 137, 138 have the similar configuration to the main transport mechanism 127.

Such a configuration as described above enables the hands H1, H2 of the main transport mechanisms 127, 128, 137, 138 to respectively move in the X and Z directions in the upper transport chamber 125, the lower transport chamber 126, the upper transport chamber 135 and the lower transport chamber 136, rotate around the axis in the Z direction, advance and retreat.

The main transport mechanism 127 can receive the substrates W from and transfer the substrates W to the processing chambers 21, 22 (FIG. 2), the substrate platforms PASS1, PASS2, PASS5, PASS6, PASS9, PASS10 (FIGS. 3 and 5) and the upper thermal processing section 301 (FIG. 3) using the hands H1, H2. The main transport mechanism 128 can receive the substrates W from and transfer the substrates W to the processing chambers 23, 24 (FIG. 2), the substrate platforms PASS3, PASS4, PASS7, PASS8, PASS11, PASS12 (FIGS. 3 and 5) and the lower thermal processing section 302 (FIG. 3) using the hands H1, H2.

The main transport mechanism 137 can receive the substrates W from and transfer the substrates W to the processing chambers 31, 32 (FIG. 2), the substrate platforms PASS5, PASS6, PASS13, PASS14 (FIGS. 3 and 5) and the upper thermal processing section 303 (FIG. 3) using the hands H1, H2. The main transport mechanism 138 can receive the substrates W from and transfer the substrates W to the processing chambers 33, 34 (FIG. 2), the substrate platforms PASS7, PASS8, PASS15, PASS16 (FIG. 5) and the lower thermal processing section 304 (FIG. 3) using the hands H1, H2.

(6) Sub-Transport Chamber and Sub-Transport Mechanisms

Next, the configuration of the sub-transport chamber 110 and the configuration and the operation of the sub-transport mechanisms 117, 118 will be described.

Figure 7:
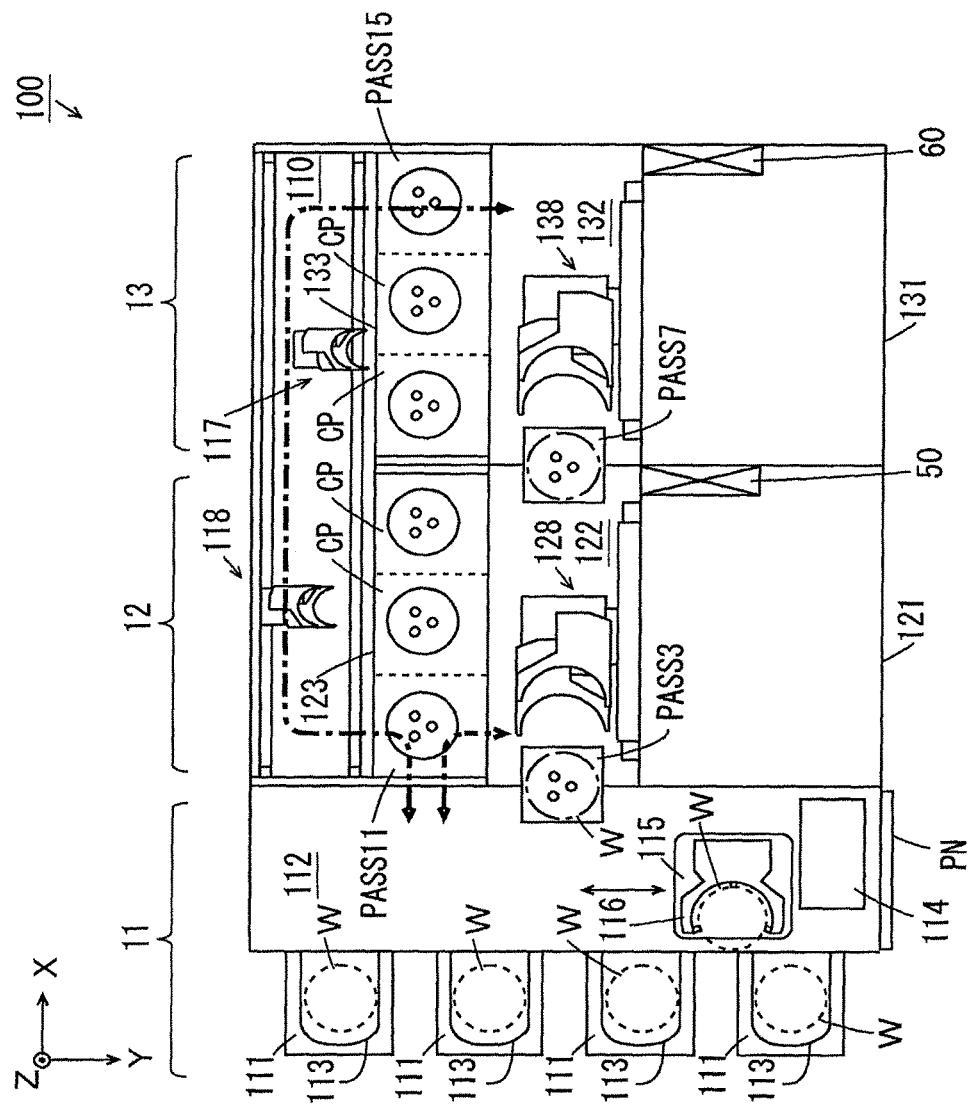
FIG. 7 is a horizontal cross sectional view of the substrate processing apparatus according to the first embodiment.

FIG. 7 is a horizontal cross sectional view of the substrate processing apparatus 100 according to the first embodiment. As shown in FIG. 7, the length of each cooling unit CP in the Y direction is shorter than the length of each thermal processing unit PHP of FIG. 1. The length of the substrate platforms PASS9 to PASS16 is substantially equal to the length of each cooling unit CP.

As shown in FIGS. 4 and 7, the sub-transport chamber 110 is provided in a space surrounded by the lowermost surface of the plurality of thermal processing units PHP in the upper thermal processing sections 301, 303, the uppermost surface of the plurality of the thermal processing units PHP in the lower thermal processing sections 302, 304, the back surfaces of the thermal processing sections 123, 133, the back surfaces of the plurality of cooling units CP (surfaces opposite to the transport section 122) and the back surfaces of the substrate platforms PASS9 to PASS16 (surfaces opposite to the transport section 122). The sub-transport chamber 110 extends from the side surface of the processing block 12 adjacent to the indexer block 11 to the side surface of the processing block 13 opposite to the indexer block 11.

In this case, with a simple configuration, the substrate W is transported to the processing chambers 21 to 24 in the first processing section 121, the upper thermal processing section 301 or the lower thermal processing section 302 in the thermal processing section 123 by the main transport mechanisms 127, 128 in the transport section 122.

Further, with a simple configuration, the substrate W is transported between the main transport mechanism 115 and the sub-transport mechanism 117, 118, and the substrate W is transported between the sub-transport mechanism 117, 118 and the main transport mechanism 137, 138 in the transport section 132. Further, with a simple configuration, the substrate W is transported to the processing chambers 31 to 34 in the second processing section 131, the upper thermal processing section 303 or the lower thermal processing section 304 in the thermal processing section 133 by the main transport mechanism 137, 138.

Thus, the processing can be respectively, independently and concurrently performed on the substrates W in the processing blocks 12, 13. Therefore, it is possible to improve the throughput of the substrate processing apparatus 100 without complicating the configuration and the control of the substrate processing apparatus 100.

Figure 8A:
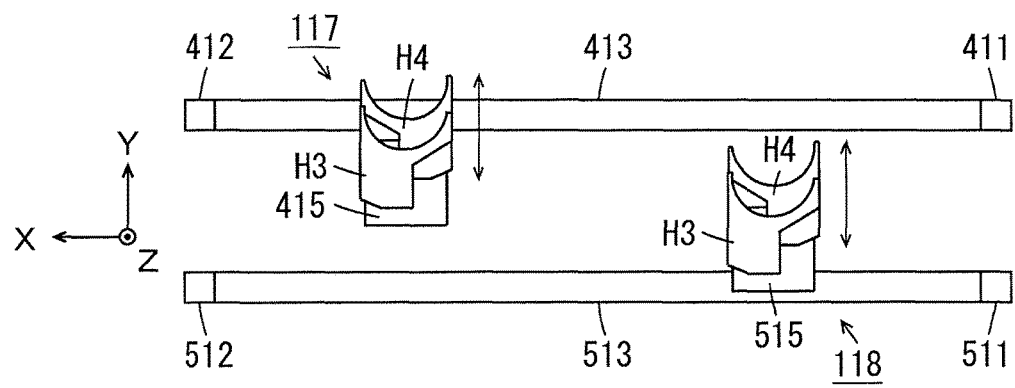
FIGS. 8A to 8C are diagrams showing the configuration of sub-transport mechanisms.
Figure 8B:
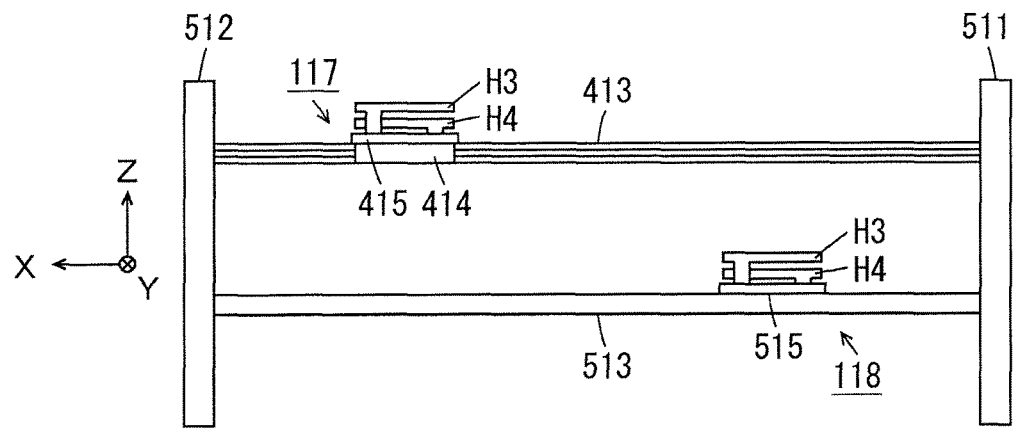
Figure 8C:
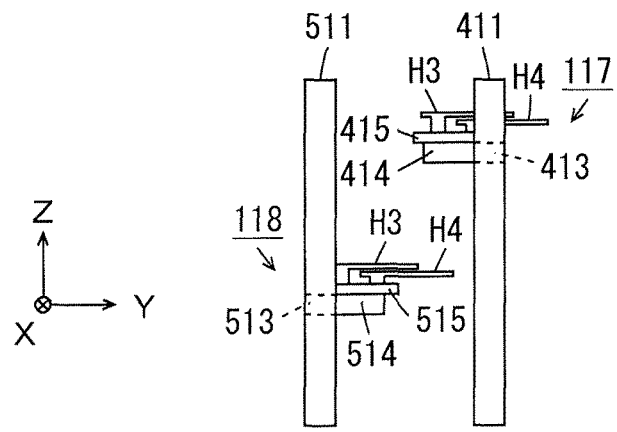

FIGS. 8A to 8C are diagrams showing the configuration of the sub-transport mechanisms 117, 118. FIGS. 8A, 8B, 8C are diagrams of the sub-transport mechanisms 117, 118 as viewed in the −Z direction, +Y direction and +X direction, respectively.

As shown in FIGS. 8A to 8C, the sub-transport mechanism 117 has long-sized guide rails 411, 412. The guide rails 411, 412 extend in the vertical direction (Z direction) and are arranged to be spaced apart from each other in the X direction in the sub-transport chamber 110 of FIG. 3. The guide rail 411 is fixed at a position in close proximity to the substrate platforms PASS9 to PASS12 at the end adjacent to the transport section 112 of FIG. 3. The guide rail 412 is fixed at a position in close proximity to the substrate platforms PASS13 to PASS16 at the end opposite to the transport section 112.

A long-sized guide rail 413 is provided between the guide rail 411 and the guide rail 412 to extend in the horizontal direction (X direction). The guide rail 413 is attached to the guide rails 411, 412 to be movable in the vertical direction. A moving member 414 is attached to the guide rail 413. The moving member 414 is provided to be movable in the X direction along the guide rail 413.

A support member 415 is provided on the upper surface of the moving member 414 to be movable in the vertical direction. Hands H3 and H4 for holding the substrates W are attached to the support member 415 to be capable of advancing and retreating in the horizontal direction (Y direction).

The sub-transport mechanism 118 includes long-sized guide rails 511, 512. The guide rails 511, 512 extend in the vertical direction (Z direction) and are arranged to be spaced apart from each other in the X direction in the sub-transport chamber 110 of FIG. 3. The guide rail 511 is fixed at a position spaced apart from the guide rail 411 in the Y direction at the end adjacent to the transport section 112 of FIG. 3. The guide rail 512 is fixed at a position spaced apart from the guide rail 412 in the Y direction at the end opposite to the transport section 112.

A long-sized guide rail 513 is provided between the guide rail 511 and the guide rail 512 to extend in the horizontal direction (X direction). The guide rail 513 is attached to the guide rails 511, 512 to be movable in the vertical direction. The moving member 514 is attached to the guide rail 513. The moving member 514 is provided to be movable in the X direction along the guide rail 513.

The support member 515 is provided on the upper surface of the moving member 514 to be movable in the vertical direction. Hands H3 and H4 for holding the substrates W are attached to the support member 515 to be capable of advancing and retreating in the horizontal direction (Y direction).

The configuration described above enables the hands H3, H4 of the sub-transport mechanisms 117, 118 to move in the X and Z directions and to advance and retreat in the Y direction in the sub-transport chamber 110 of FIG. 3.

The support members 415, 515 may be provided at the moving members 414, 514 to be rotatable around an axis in the Z direction, respectively. In this case, the hands H3, H4 of the sub-transport mechanisms 117, 118 can be rotated around the axis in the Z direction.

The hands H3, H4 of the sub-transport mechanisms 117, 118 can move in the Z direction within a small range by the movement of the support members 415, 515 in the vertical direction. Further, the hands H3, H4 of the sub-transport mechanisms 117, 118 can move in the Z direction within a range from the upper end to the lower end in the sub-transport chamber 110 by the movement of the guide rails 413, 513 in the vertical direction. Hereinafter, the movement of the hands H3, H4 in the Z direction caused by the movement of the support members 415, 515 in the vertical direction is referred to as a normal movement, and the movement of the hands H3, H4 in the Z direction caused by the movement of the guide rails 413, 513 in the vertical direction is referred to as an emergency movement.

The sub-transport mechanism 117 can normally receive the substrate W from and transfer the substrate W to the substrate platforms PASS9, PASS10, PASS13, PASS14 (FIG. 3) by the movement of the hands H3, H4 in the X direction and the normal movement in the Z direction. Further, the sub-transport mechanism 118 can normally receive the substrate W from and transfer the substrate W to the substrate platforms PASS11, PASS12, PASS15, PASS16 (FIG. 3) by the movement of the hands H3, H4 in the X direction and the normal movement in the Z direction.

When an abnormality such as failure occurs to the sub-transport mechanism 118, the sub-transport mechanism 117 can receive the substrate W from and transfer the substrate W to the substrate platforms PASS9 to PASS16 (FIG. 3) by the movement of the hands H3, H4 in the X direction and the emergency movement in the Z direction. Further, when an abnormality such as failure occurs to the sub-transport mechanism 117, the sub-transport mechanism 118 can receive the substrate W from and transfer the substrate W to the substrate platform PASS9 to PASS16 (FIG. 3) by the movement of the hands H3, H4 in the X direction and the emergency movement in the Z direction.

(7) One Example of Transportation of Substrate in Substrate Processing Apparatus (7-1) Schematic Operation Hereinafter, the substrate W that has not been processed in the processing blocks 12, 13 is referred to as an unprocessed substrate W, and the substrate W that has been processed in the processing blocks 12, 13 is referred to as a processed substrate.

In the present example, as shown by the one-dot and dash line in FIG. 7, the unprocessed substrate W is transported from the indexer block 11 to the processing block 12 via the sub-transport chamber 110, and the unprocessed substrate W is transported from the indexer block 11 to the processing block 13 via the sub-transport chamber 110. Further, the processed substrate W is transported from the processing block 12 to the indexer block 11 via the sub-transport chamber 110, and the processed substrate W is transported from the processing block 13 to the indexer block 11 via the sub-transport chamber 110.

In the present example, the substrate W is transported between the main transport mechanism 115 and the sub-transport mechanism 117, 118 or between the main transport mechanism 115 and the main transport mechanism 127, 128 via the substrate platform PASS9 to PASS12. Thus, even when the time point of transportation by the main transportation mechanism 115, the sub-transport mechanisms 117, 118, and the main transport mechanisms 127, 128 are different, the substrate W can be reliably transported between the main transport mechanism 115 and the sub-transport mechanism 117, 118 or between the main transport mechanism 115 and the main transport mechanism 127, 128.

Similarly, the substrate W is transported between the sub-transport mechanism 117, 118 and the main transport mechanism 137, 138 via the substrate platform PASS13 to PASS16. Thus, even when the time point of transportation by the sub-transport mechanisms 117, 118 and the main transport mechanisms 137, 138 are different, the substrate W can be reliably transported between the sub-transport mechanism 117, 118 and the main transport mechanism 137, 138.

While the substrate platforms PASS1 to PASS8 are not used in transportation of the present example, the substrate platforms PASS1 to PASS8 may be used for transporting the substrate W between the indexer block 11 and the processing block 12.

(7-2) Transportation in Indexer Block

The transportation in the indexer block 11 will be described below mainly using FIGS. 1, 3 and 5.

The carrier 113 in which the unprocessed substrates W are stored is placed on the carrier platform 111 in the indexer block 11. The main transport mechanism 115 takes out the single substrate W from the carrier 113 and transports the substrate W to the substrate platform PASS9. Thereafter, the main transport mechanism 115 takes out another unprocessed single substrate W from the carrier 113 and transports the substrate W to the substrate platform PASS11.

When the processed substrate W is placed on the substrate platform PASS10, the main transport mechanism 115 takes out the processed substrate W from the substrate platform PASS10 after transporting the unprocessed substrate W to the substrate platform PASS9. Then, main transport mechanism 115 transports the processed substrate W to the carrier 113.

Similarly, when the processed substrate W is placed on the substrate platform PASS12, the main transport mechanism 115 takes out the processed substrate W from the substrate platform PASS12 after transporting the unprocessed substrate W to the substrate platform PASS11. Then, the transport mechanism 115 transports the processed substrate W to the carrier 113.

In this case, the substrate W stored in the carrier 113 of the carrier platform 111 is sequentially transported to the substrate platforms PASS9, PASS11 by the main transport mechanism 115. Further, the substrates W placed on the substrate platforms PASS10, PASS12 are sequentially stored in the carrier 113 on the carrier platform 111. Thus, the plurality of substrates W can be efficiently processed.

(7-3) Transportation in Sub-Transport Chamber

Next, one example of transportation in the sub-transport chamber 110 will be described mainly using FIGS. 3, 4 and 7.

The sub-transport mechanism 117 takes out the unprocessed substrate W placed on the substrate platform PASS9 using the hand H3. Further, the sub-transport mechanism 117 places the processed substrate W held by the hand H4 on the substrate platform PASS10.

Then, the sub-transport mechanism 117 moves the hands H3, H4 from positions opposite to the substrate platforms PASS9, PASS10 to positions opposite to the substrate platforms PASS13, PASS14. The sub-transport mechanism 117 places the unprocessed substrate W held by the hand H3 on the substrate platform PASS13. Further, the sub-transport mechanism 117 takes out the processed substrate W from the substrate platform PASS14 using the hand H4. Thereafter, the sub-transport mechanism 117 moves the hands H3, H4 from the positions opposite to the substrate platforms PASS13, PASS14 to the positions opposite to the substrate platforms PASS9, PASS10, and transports the substrate W held by the hand H4 to the substrate platform PASS10.

When the sub-transport mechanism 117 is transporting the substrate W between the substrate platform PASS9, PASS10 and the substrate platform PASS13, PASS14, the unprocessed substrate W is placed on the substrate platform PASS9 by the main transport mechanism 115 in the indexer block 11 and is taken out by the main transport mechanism 127 in the processing block 12. Further, the processed substrate W is placed on the substrate platform PASS10 by the main transport mechanism 127 in the processing block 12 and is taken out by the main transport mechanism 115 in the indexer block 11.

The sub-transport mechanism 118 takes out the unprocessed substrate W placed on the substrate platform PASS11 using the hand H3. Further, the sub-transport mechanism 118 places the processed substrate W held by the hand H4 on the substrate platform PASS12.

Next, the sub-transport mechanism 118 moves the hands H3, H4 from positions opposite to the substrate platforms PASS11, PASS12 to positions opposite to the substrate platforms PASS15, PASS16. The sub-transport mechanism 118 places the unprocessed substrate W held by the hand H3 on the substrate platform PASS15. Further, the sub-transport mechanism 118 takes out the processed substrate W from the substrate platform PASS16 using the hand H4. Thereafter, the sub-transport mechanism 118 moves the hands H3, H4 from the positions opposite to the substrate platforms PASS15, PASS16 to the positions opposite to the substrate platforms PASS11, PASS12, and transports the substrate W held by the hand H4 to the substrate platform PASS12.

When the sub-transport mechanism 118 is transporting the substrate W between the substrate platform PASS11, PASS12 and the substrate platform PASS15, PASS16, the unprocessed substrate W is placed on the substrate platform PASS11 by the main transport mechanism 115 in the indexer block 11 and is taken out by the main transport mechanism 128 in the processing block 12. Further, the processed substrate W is placed on the substrate platform PASS12 by the main transport mechanism 128 in the processing block 12 and taken out by the main transport mechanism 115 in the indexer block 11.

(7-4) Transportation in Processing Block 12

The transportation in the processing block 12 will be described mainly using FIGS. 1, 2, 3 and 5.

The main transport mechanism 127 takes out the unprocessed substrate W placed on the substrate platform PASS9 using the hand H1. Further, the main transport mechanism 127 places the processed substrate W held by the hand H2 on the substrate platform PASS10. The substrate W placed on the substrate platform PASS10 from the main transport mechanism 127 is the substrate W after the resist film formation.

Next, the main transport mechanism 127 takes out the substrate W after the cooling processing from the one cooling unit CP in the upper thermal processing section 301 using the hand H2. Further, the main transport mechanism 127 carries in the unprocessed substrate W held by the hand H1 to the cooling unit CP. In the cooling unit CP, the substrate W is cooled to a temperature suitable for the resist film formation processing.

Then, the main transport mechanism 127 takes out the substrate W after the resist film formation from the spin chuck 25 in the processing chamber 21 or the processing chamber 22 using the hand H1. Further, the main transport mechanism 127 places the substrate W after the cooling processing held by the hand H2 on the spin chuck 25. In the processing chamber 21, 22, the resist film is formed on the substrate W.

Then, the main transport mechanism 127 takes out the substrate W after the thermal processing from the one thermal processing unit PHP in the upper thermal processing section 301 using the hand H2. Further, the main transport mechanism 127 carries in the substrate W after the cooling processing held by the hand H1 to the thermal processing unit PHP. In the thermal processing unit PHP, the heating processing and the cooling processing for the substrate W are successively performed.

The main transport mechanism 127 transports the processed substrate W that has been taken out from the thermal processing unit PHP to the substrate platform PASS10.

Similarly, the main transport mechanism 128 in the lower transport chamber 126 sequentially transports the substrate W using the hands H1, H2 among the substrate platform PASS11, the one cooling unit CP in the lower thermal processing section 302, the processing chamber 23 or the processing chamber 24, the one thermal processing unit PHP and the substrate platform PASS12. Thus, the substrate W is cooled to a temperature suitable for the resist film formation, the resist film is formed on the substrate W and the heating processing and the cooling processing are performed on the substrate W. The processed substrate W is transported to the substrate platform PASS12.

(7-5) Transportation in Processing Block 13

The transportation in the processing block 13 will be described mainly using FIGS. 1, 2, 3 and 5.

The main transport mechanism 137 in the upper transport chamber 135 sequentially transports the substrate W among the substrate platform PASS13, the one cooling unit CP in the upper thermal processing section 303, the processing chamber 31 or the processing chamber 32, the one thermal processing unit PHP and the substrate platform PASS14 using the hands H1, H2. Thus, the substrate W is cooled to a temperature suitable for the resist film formation, the resist film is formed on the substrate W, and the heating processing and the cooling processing are performed on the substrate W. The processed substrate W is transported to the substrate platform PASS14.

The main transport mechanism 138 in the lower transport chamber 136 sequentially transports the substrate W among the substrate platform PASS15, the one cooling unit CP in the lower thermal processing section 304, the processing chamber 33 or the processing chamber 34, the one thermal processing unit PHP and the substrate platform PASS16 using the hands H1, H2. Thus, the substrate W is cooled to a temperature suitable for the resist film formation processing, the resist film is formed on the substrate W, and the heating processing and the cooling processing are performed on the substrate W. The processed substrate W is transported to the substrate platform PASS16.

(7-6) Transportation in Sub-Transport Chamber at the Time of Abnormality

Next, the transportation at the time of abnormality will be described mainly using FIG. 3.

When an abnormality such as a failure occurs to the sub-transport mechanism 118, the sub-transport mechanism 117 transports the substrate W between the substrate platform PASS9, PASS10 and the substrate platform PASS13, PASS14, and transports the substrate W between the substrate platform PASS11, PASS12 and the substrate platform PASS15, PASS16 by the movement in the X direction and an emergency movement in the Z direction of the hands H3, H4.

Further, when an abnormality such as a failure occurs to any one of the main transport mechanisms 127, 128, 137, 138 or any one of the processing blocks 12, 13, the sub-transport mechanism 117 performs the movement in the X direction and the emergency movement in the Z direction of the hands H3, H4. Thus, the sub-transport mechanism 117 can transport the substrate W between the substrate platform PASS9, PASS10 and the substrate platform PASS15, PASS16, and transports the substrate W between the substrate platform PASS11, PASS12 and the substrate platform PASS13, PASS14. As a result, even when an abnormality such as a failure occurs to any one of the main transport mechanisms 127, 128, 137, 138 or any one of the processing blocks 12, 13, the processing for the substrate W can continue.

Similarly, when an abnormality such as a failure occurs to the sub-transport mechanism 117, the sub-transport mechanism 118 transports the substrate W between the substrate platform PASS9, PASS10 and the substrate platform PASS13, PASS14, and transports the substrate W between the substrate platform PASS11, PASS12 and the substrate platform PASS15, PASS16 by the movement in the X direction and the emergency movement in the Z direction of the hands H3, H4.

Further, when an abnormality such as a failure occurs to any one of the main transport mechanisms 127, 128, 137, 138 or any one of the processing blocks 12, 13, the sub-transport mechanism 118 performs the movement in the X direction and the emergency movement in the Z direction of the hands H3, H4. Thus, the sub-transport mechanism 118 can transport the substrate W between the substrate platform PASS9, PASS10 and the substrate platform PASS15, PASS16, and transports the substrate W between the substrate platform PASS11, PASS12 and the substrate platform PASS13, PASS14. As a result, when an abnormality such as a failure occurs to any one of the main transport mechanisms 127, 128, 137, 138 or any one of the processing blocks 12, 13, the processing for the substrate W can continue.

(8) Effects

In the substrate processing apparatus 100 according to the present embodiment, the resist film formation processing is performed on the substrates W by the processing blocks 12, 13. This configuration enables the transportation of the substrate W between the indexer block 11 and the processing block 13 without the use of the main transport mechanisms 127, 128 in the processing block 12. Thus, the throughput in the indexer block 11 or the processing block 13 can be prevented from being restricted by the throughput in the processing block 12. Therefore, the throughput of the substrate processing apparatus 100 can be improved.

Further, the above-mentioned configuration enables the main transport mechanisms 127, 128 and the main transport mechanisms 137, 138 to perform the same or similar transportation. Thus, it is possible to prevent the control of transportation of the substrates W by the main transport mechanisms 127, 128 and the main transport mechanisms 137, 138 from being complicated. Therefore, software that controls the main transport mechanisms 127, 128 and the main transport mechanisms 137, 138 can be simplified.

[2] Second Embodiment (1) Configuration of Substrate Processing Apparatus

Figure 9:
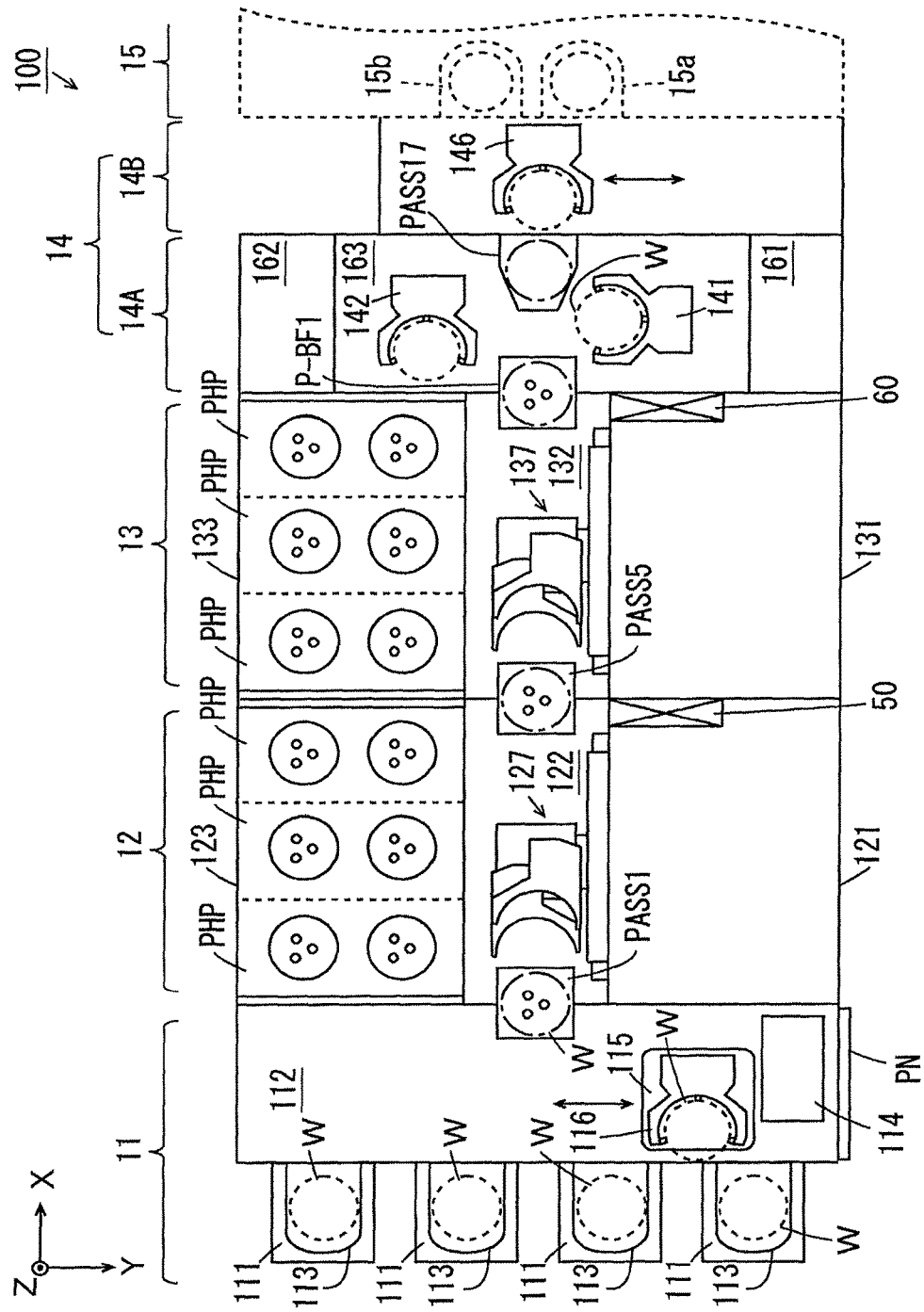
FIG. 9 is a schematic plan view of the substrate processing apparatus according to a second embodiment of the present invention.
Figure 10:
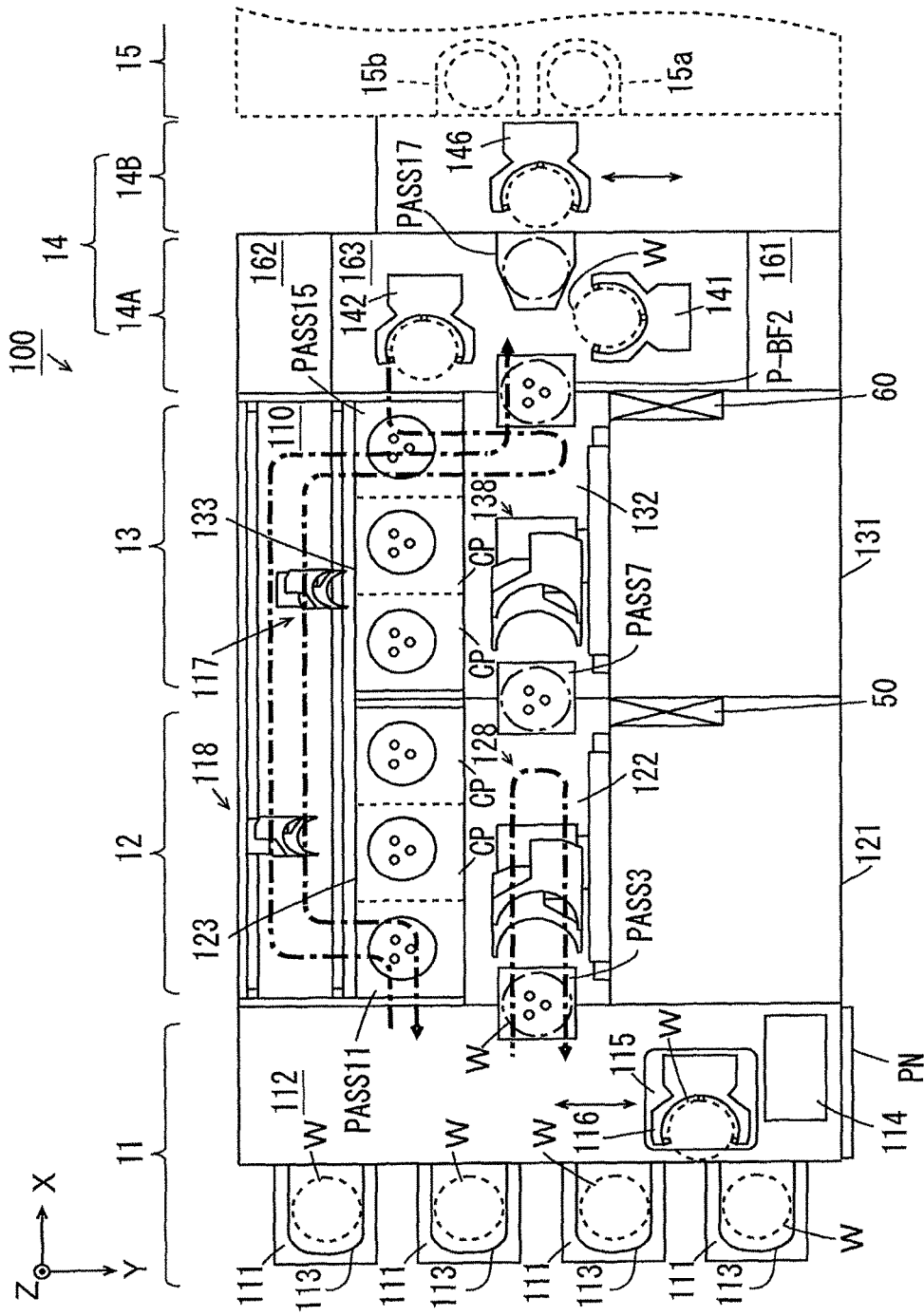
FIG. 10 is a horizontal cross sectional view of the substrate processing apparatus according to the second embodiment.

As for the substrate processing apparatus according to the second embodiment, difference from the substrate processing apparatus 100 according to the first embodiment will be described. FIG. 9 is a schematic plan view of the substrate processing apparatus according to the second embodiment of the present invention. FIG. 10 is a horizontal cross sectional view of the substrate processing apparatus 100 according to the second embodiment. In the present embodiment, the configuration of the processing block 13 is similar to the configuration of the processing block 13 in the first embodiment except for that the second processing section 131 is a development processing section.

As shown in FIGS. 9 and 10, the substrate processing apparatus 100 further includes a cleaning/drying processing block 14A and a carry-in/carry-out block 14B. An interface block 14 is constituted by the cleaning/drying processing block 14A and the carry-in/carry-out block 14B. An exposure device 15 is arranged to be adjacent to the carry-in/carry-out block 14B.

The cleaning/drying processing block 14A includes cleaning/drying processing sections 161, 162 and a transport section 163. The cleaning/drying processing sections 161, 162 are provided to be opposite to each other with the transport section 163 sandwiched therebetween. Main transport mechanisms 141, 142 are provided in the transport section 163. A placement/buffer section P-BF1 and an after-mentioned placement/buffer section P-BF2 (FIG. 13) are provided between the transport section 163 and the transport section 132. The placement/buffer sections P-BF1, P-BF2 are configured to be capable of storing the plurality of substrates W.

Further, a substrate platform PASS17 and after-mentioned placement/cooling platforms P-CP (FIG. 13) are provided between the main transport mechanisms 141, 142 to be adjacent to the carry-in/carry-out block 14B. Each placement/cooling platform P-CP has a function of cooling the substrates W (a cooling plate, for example). The substrate W is cooled to a temperature suitable for exposure processing in the placement/cooling platform P-CP.

The main transport mechanism 146 is provided in the carry-in/carry-out block 14B. The main transport mechanism 146 carries in the substrate W to and carries out the substrate W from the exposure device 15. The exposure device 15 is provided with a substrate inlet 15a for carrying in the substrate W and a substrate outlet 15b for carrying out the substrate W. Note that, the substrate inlet 15a and the substrate outlet 15b of the exposure device 15 may be arranged to be adjacent to each other in a horizontal direction or may be arranged one above the other.

Accordingly, only the carry-in/carry-out block 14B is moved while the cleaning/drying processing block 14A is not moved at the time of the maintenance operation of the cleaning/drying processing block 14A, the carry-in/carry-out block 14B and the exposure device 15, thus significantly reducing the labor of workers and working time.

(2) Configuration of First Processing Section and Second Processing Section

Figure 11:
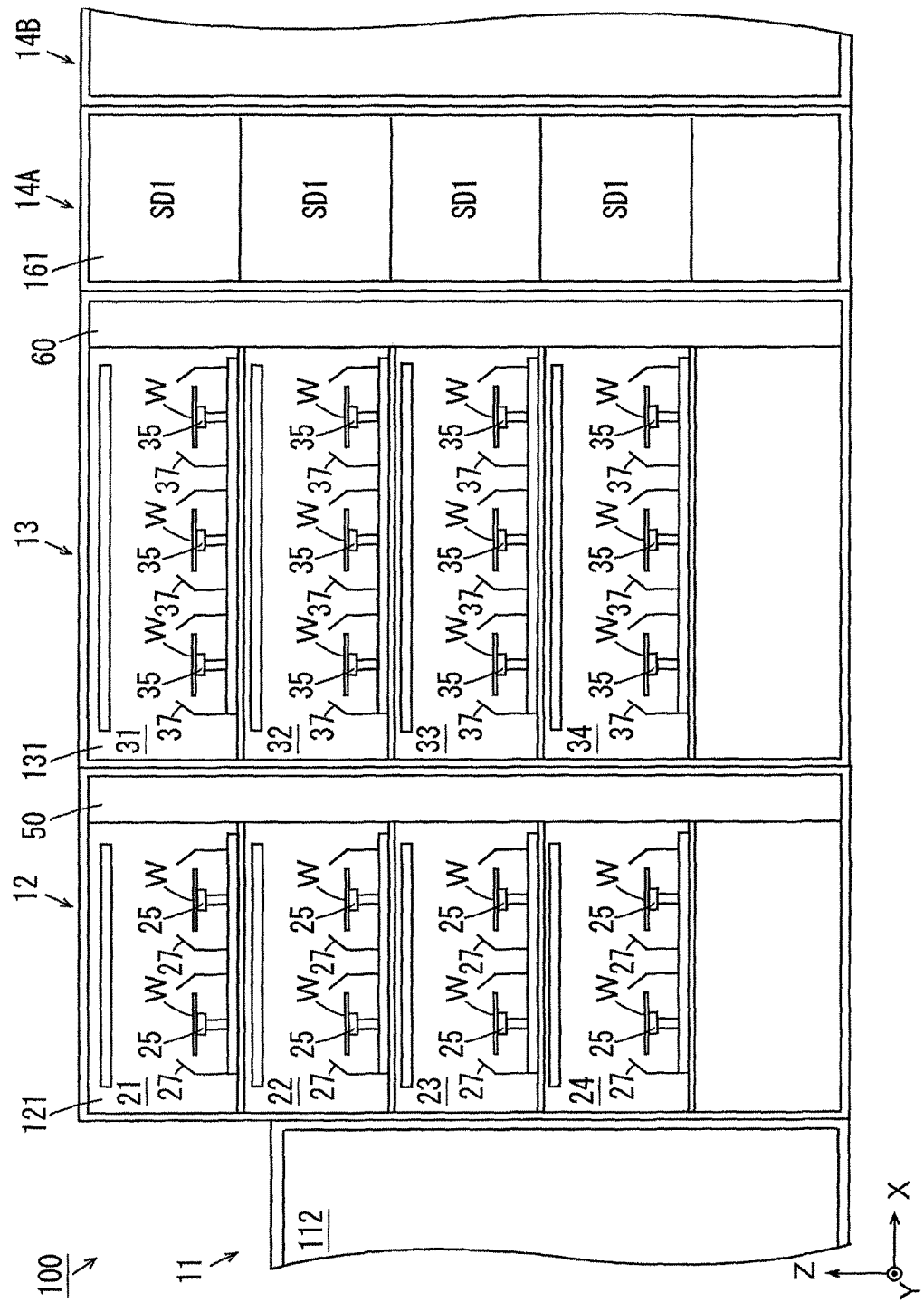
FIG. 11 is a diagram of the first processing section, the second processing section and a cleaning/drying processing section of FIG. 9 as viewed in the −Y direction.

FIG. 11 is a diagram of the first processing section 121, the second processing section 131 and the cleaning/drying processing section 161 of FIG. 9 as viewed in the −Y direction. In the present embodiment, the processing chambers 31 to 34 are development processing chambers. As shown in FIG. 11, each processing chamber 31 to 34 is provided with a plurality of spin chucks 35, a plurality of cups 37 and a plurality of development liquid nozzles (not shown). In the present embodiment, the three spin chucks 35 and the three cups 37 are provided in each processing chamber 31 to 34.

Each spin chuck 35 is driven to be rotated by a driving device (an electric motor, for example) while holding the substrate W. The cup 37 is provided to surround the spin chuck 35. A development liquid is discharged from the development liquid nozzle as the processing liquid while the spin chuck 35 is rotated, whereby the development liquid is supplied to the rotating substrate W. Thus, the development processing for the substrate W is performed.

A plurality (four in this example) of cleaning/drying processing units SD1 are provided in the cleaning/drying processing section 161. In each cleaning/drying processing unit SD1, cleaning and drying processing for the substrate W before the exposure processing is performed. In the cleaning/drying processing unit SD1, polishing processing may be performed on the back surface of the substrate W and the end of the substrate W (a bevel portion) using a brush and the like. Here, the back surface of the substrate W refers to a surface opposite to the surface of the substrate W on which various patterns such as a circuit pattern are to be formed.

(3) Configuration of Thermal Processing Section

Figure 12:
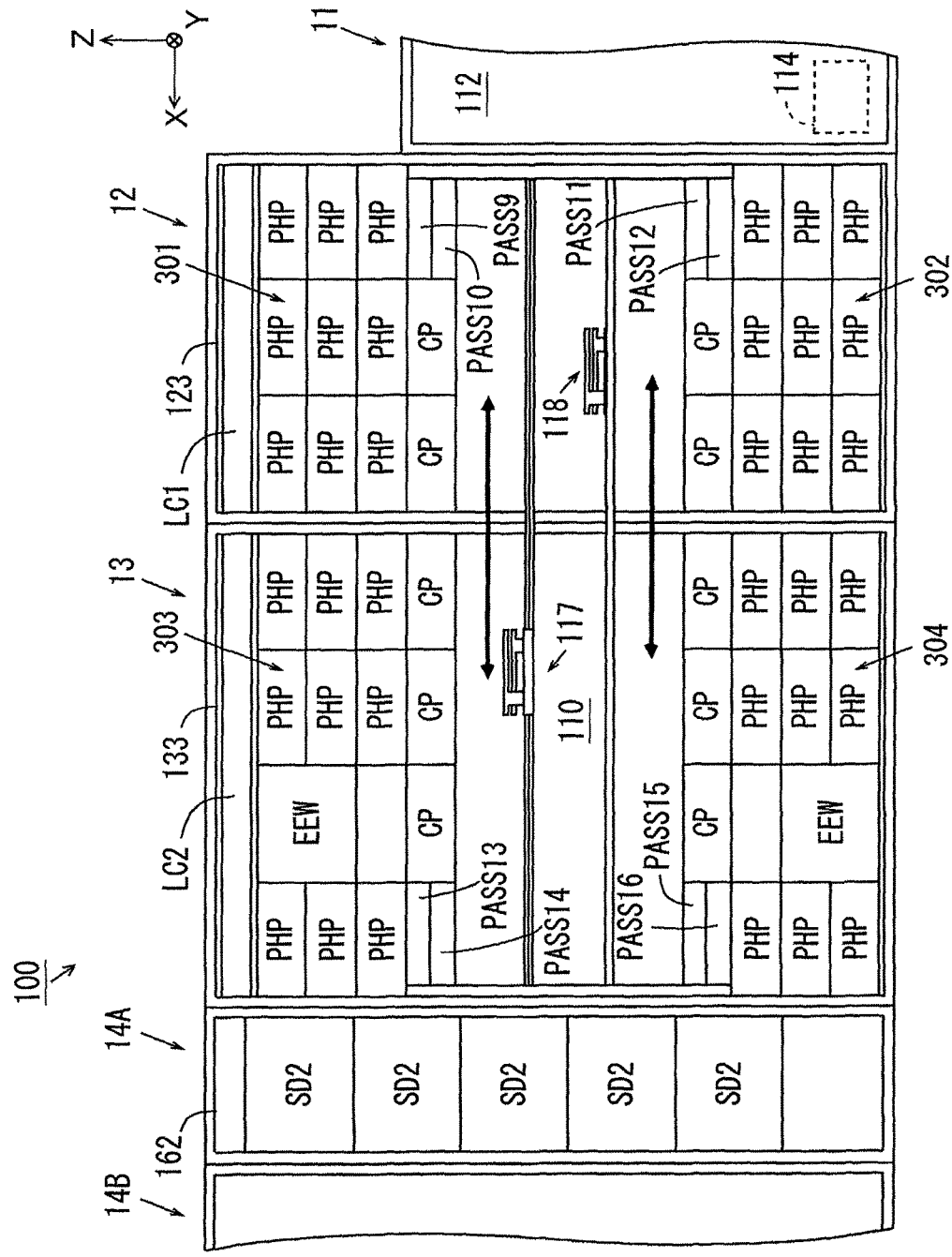
FIG. 12 is a diagram of the thermal processing sections and the cleaning/drying processing section of FIG. 9 as viewed in the +Y direction.

FIG. 12 is a diagram of the thermal processing sections 123, 133 and the cleaning/drying processing section 162 of FIG. 9 as viewed in the +Y direction. As shown in FIG. 12, in the present embodiment, an edge exposure unit EEW is further provided in the upper thermal processing section 303. Further, an edge exposure unit EEW is further provided in the lower thermal processing section 304.

In the edge exposure unit EEW, exposure processing for the peripheral edge of the substrate W (edge exposure processing) is performed. The edge exposure processing is performed on the substrate W such that the resist film on the peripheral edge of the substrate W is removed at the time of the subsequent development processing. Thus, when the peripheral edge of the substrate W comes into contact with another portion after the development processing, the resist film on the peripheral edge of the substrate W is prevented from detaching and becoming particles.

A plurality (five in this example) of cleaning/drying processing units SD2 are provided in the cleaning/drying processing section 162. In each cleaning/drying processing unit SD2, the cleaning and drying processing for the substrate W after the exposure processing are performed.

(4) Configuration of Transport Sections

Figure 13:
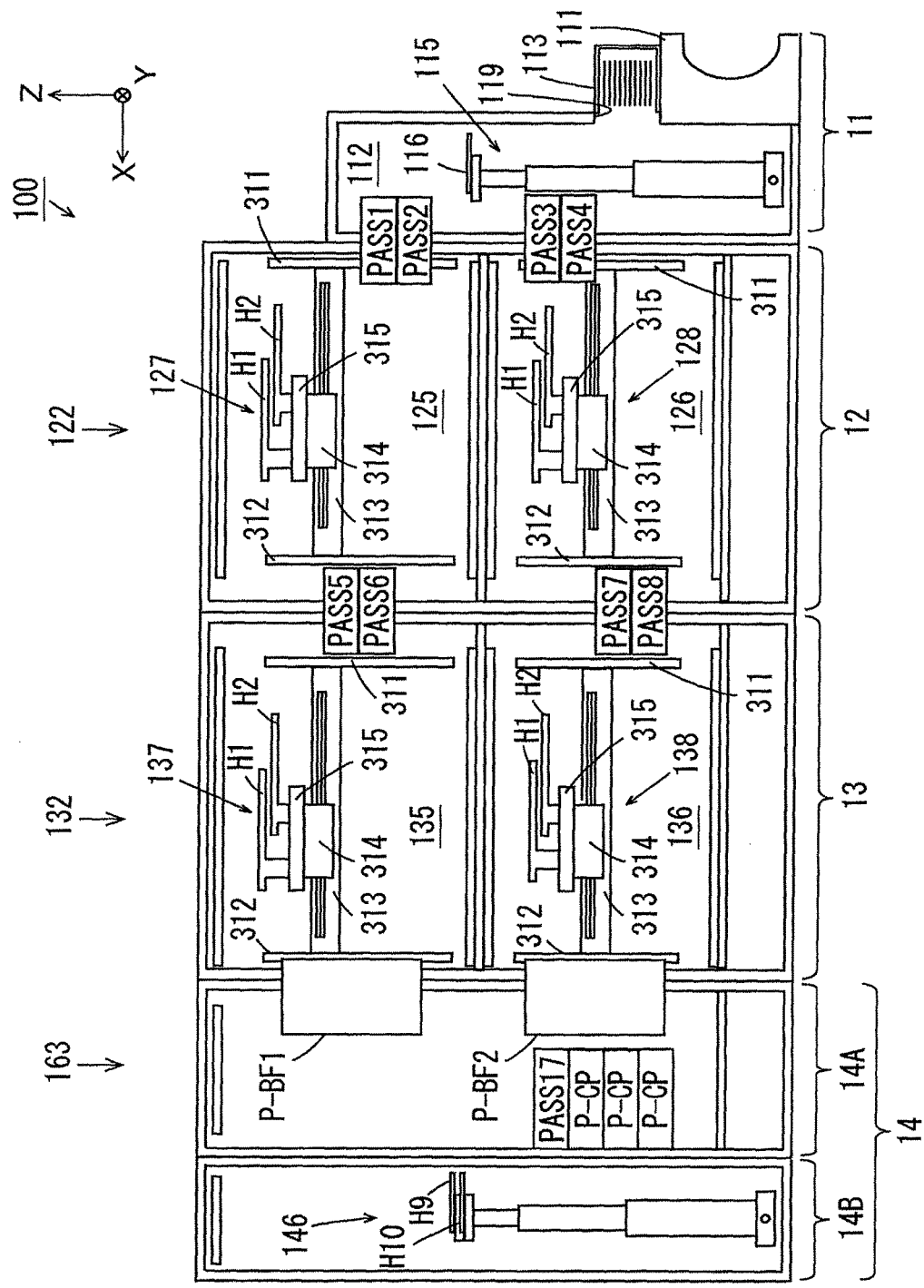
FIG. 13 is a diagram of the transport sections of FIG. 9 as viewed in the +Y direction.

FIG. 13 is a diagram of the transport sections 122, 132, 163 of FIG. 9 as viewed in the +Y direction. As shown in FIG. 13, the placement/buffer section P-BF1 is provided between the upper transport chamber 135 and the transport section 163, and the placement/buffer section P-BF2 is provided between the lower transport chamber 136 and the transport section 163. The substrate platform PASS17 and the plurality of placement/cooling platforms P-CP are provided in the transport section 163 to be adjacent to the carry-in/carry-out block 14B.

The placement/buffer section P-BF1 is configured such that the substrates W can be carried in and carried out by the main transport mechanism 137 and the main transport mechanisms 141, 142 (FIG. 9). The placement/buffer section P-BF2 is configured such that the substrates W can be carried in and carried out by the main transport mechanism 138 and the main transport mechanisms 141, 142 (FIG. 9). The substrate platform PASS17 and the placement/cooling platforms P-CP are configured such that the substrates W can be carried in and carried out by the main transport mechanisms 141, 142 (FIG. 9) and the main transport mechanism 146.

While the only one substrate platform PASS17 is provided in the example of FIG. 13, the plurality of substrate platforms PASS17 may be provided one above the other. In this case, the plurality of substrate platforms PASS17 may be used as buffer sections on which the substrates W are temporarily placed.

The substrate W that is transported from the processing block 13 to the cleaning/drying block 14A is placed in the placement/buffer section P-BF1, P-BF2, the substrate W that is transported from the cleaning/drying processing block 14A to the carry-in/carry-out block 14B are placed on the placement/cooling platform P-CP, and the substrate W that is transported from the carry-in/carry-out block 14B to the cleaning/drying processing block 14A is placed on the substrate platform PASS17. The main transport mechanism 146 in the carry-in/carry-out block 14B has hands H9, H10 for holding the substrates W.

(5) Configuration of Cleaning/Drying Processing Block

Figure 14:
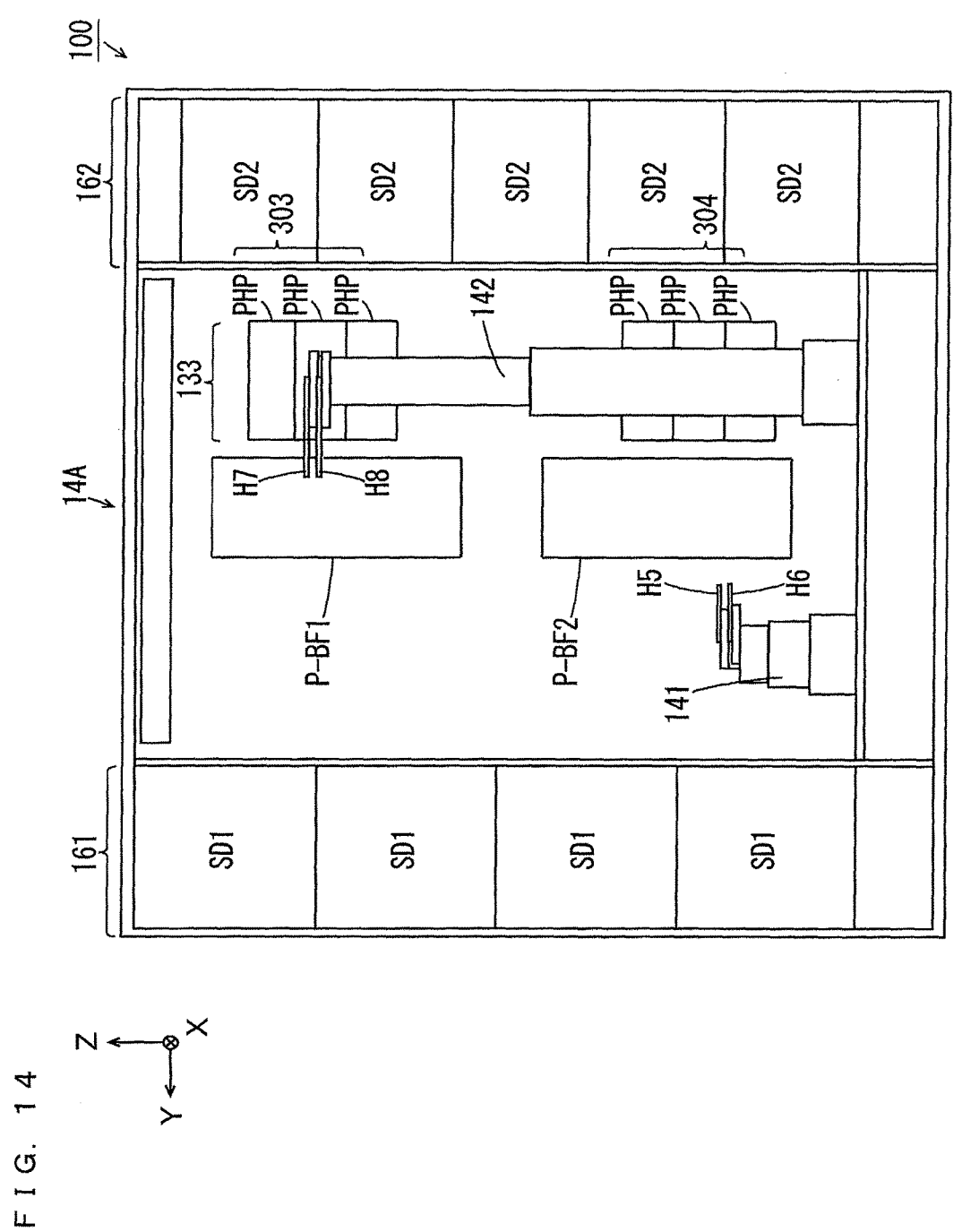
FIG. 14 is a diagram showing the inner configuration of a cleaning/drying processing block.

FIG. 14 is a diagram showing the internal configuration of the cleaning/drying processing block 14A. FIG. 14 is a diagram of the cleaning/drying processing block 14A as viewed in the −X direction. As shown in FIG. 14, the main transport mechanism 141 has hands H5, H6 for holding the substrates W, and the main transport mechanism 142 has hands H7, H8 for holding the substrates W.

The cleaning/drying processing units SD1 are provided in a stack on the +Y side of the main transport mechanism 141, and the cleaning/drying processing units SD2 are provided in a stack on the −Y side of the main transport mechanism 142. The placement/buffer sections P-BF1, P-BF2 are provided one above the other on the −X side between the main transport mechanisms 141, 142. Further, the thermal processing units PHP of the upper thermal processing section 303 and the thermal processing units PHP of the lower thermal processing section 304 are configured such that the substrates W can be carried in from the cleaning/drying processing block 14A.

(6) One Example of Transportation of Substrate in Substrate Processing Apparatus (6-1) Schematic Operation As shown by the one-dot and dash line in FIG. 10, the unprocessed substrate W is transported from the indexer block 11 to the transport section 122 in the processing block 12 via the substrate platform PASS1, PASS3, and the substrate W on which the resist films has been formed in the processing block 12 is transported to the indexer block 11 via the substrate platform PASS2, PASS4.

Further, the substrate W on which the resist film has been formed is transported from the indexer block 11 to the transport section 132 in the processing block 13 via the sub-transport chamber 110 and is further transported to the interface block 14 via the placement/buffer section P-BF1, P-BF2. The substrate W that has been processed in the interface block 14 is carried into the exposure device 15, and the substrate W after the exposure processing by the exposure device 15 is carried out to the interface block 14. The substrate W that has been processed in the interface block 14 is transported to the transport section 132 via the thermal processing unit PHP in the upper thermal processing section 303 or the lower thermal processing section 304 in the processing block 13. The substrate W on which the development processing has been performed in the processing block 13 is transported to the indexer block 11 via the sub-transport chamber 110.

(6-2) Transportation in Indexer Block

The operation of the indexer block 11 will be described below mainly using FIGS. 9, 12 and 13. In the present embodiment, the unprocessed substrates W are stored in part of the plurality of carriers 113, and the substrates W on which the resist films are formed are stored in the other carriers 113.

The main transport mechanism 115 in the present embodiment takes out the single unprocessed substrate W from the carrier 113, and transports the substrate W to the substrate platform PASS1. Thereafter, the main transport mechanism 115 takes out another unprocessed substrate W from the carrier 113 and transports the substrate W to the substrate platform PASS3.

When the substrate W after the resist film formation is placed on the substrate platform PASS2, the main transport mechanism 115 takes out the substrate W after the resist film formation from the substrate platform PASS2 after transporting the unprocessed substrate W to the substrate platform PASS1. Then, the main transport mechanism 115 transports the substrate W after the resist film formation to the carrier 113.

Similarly, when the substrate W after the resist film formation is placed on the substrate platform PASS4, the main transport mechanism 115 takes out the substrate W after the resist film formation from the substrate platform PASS4 after transporting the unprocessed substrate W to the substrate platform PASS3. Then, the main transport mechanism 115 transports the substrate W after the resist film formation to the carrier 113.

Further, the main transport mechanism 115 transports the substrate W on which the resist film is formed from the carrier 113 to the substrate platform PASS9, PASS11. Further, the main transport mechanism 115 takes out the substrate W after the development processing from the substrate platform PASS10, PASS12.

(6-3) Transportation in Sub-Transport Chamber

Next, one example of the transportation in the sub-transport chamber 110 will be described mainly using FIGS. 9, 10 and 13. The operation of the sub-transport mechanisms 117, 118 in the present embodiment is similar to the operation of the sub-transport mechanisms 117, 118 in the first embodiment except for the following point.

In the present embodiment, all the substrates W placed on the substrate platform PASS9 are transported to the substrate platform PASS13 by the sub-transport mechanism 117. Further, all the substrates W placed on the substrate platform PASS11 are transported to the substrate platform PASS15 by the sub-transport mechanism 118.

(6-4) Transportation in Processing Block 12

The operation of the processing block 12 will be described mainly using FIGS. 11 to 13. The operation of the processing block 12 in the present embodiment is similar to the operation of the processing block 12 according to the first embodiment except for the following point. The resist film formation processing is performed on the plurality of substrates W in the processing block 12.

The main transport mechanism 127 takes out the unprocessed substrate W from the substrate platform PASS1 not the substrate platform PASS9. Further, the main transport mechanism 127 transports the processed substrate W to the substrate platform PASS2 not to the substrate platform PASS10. The main transport mechanism 128 takes out the unprocessed substrate W from the substrate platform PASS3 not from the substrate platform PASS11. Further, the main transport mechanism 128 transports the processed substrate W to the substrate platform PASS4 not to the substrate platform PASS12.

(6-5) Transportation in Processing Block 13

The operation of the processing block 13 will be described mainly using FIGS. 11 to 13.

The main transport mechanism 137 in the upper transport chamber 135 sequentially transports the substrate W on which the resist film is formed among the substrate platform PASS13, the edge exposure unit EEW in the upper thermal processing section 303 and the placement/buffer section P-BF1 using the hands H1, H2. Thus, the edge exposure processing is performed on the substrate W, and the substrate W after the edge exposure processing is transported to the placement/buffer section P-BF1.

Further, the main transport mechanism 137 sequentially transports the substrate W after the exposure processing by the exposure device 15 among the one thermal processing unit PHP, the one cooling unit CP, the processing chamber 31 or the processing chamber 32, another thermal processing unit PHP and the substrate platform PASS14 in the upper thermal processing section 303 using the hands H1, H2. Thus, post exposure bake (PEB) processing, the cooling processing, the development processing and the heating processing are sequentially performed on the substrate W. The substrate W after the development processing is transported to the substrate platform PASS14.

Similarly, the main transport mechanism 138 in the lower transport chamber 136 transports the substrate W on which the resist film is formed among the substrate platform PASS15, the edge exposure unit EEW in the lower thermal processing section 304 and the placement/buffer section P-BF2 using the hands H1, H2. Thus, the edge exposure processing is performed on the substrate W, and the substrate W after the edge exposure processing is transported to the placement/buffer section P-BF2.

Further, the main transport mechanism 138 sequentially transports the substrate W after the exposure processing by the exposure device 15 among the one thermal processing unit PHP, the one cooling unit CP, the processing chamber 33 or the processing chamber 34, another thermal processing unit PHP and the substrate platform PASS16 in the lower thermal processing section 304 using the hands H1, H2. Thus, the PEB processing, the cooling processing, the development processing and the heating processing are sequentially performed on the substrate W. The substrate W after the development processing is transported to the substrate platform PASS16.

In a case in which the development processing can be appropriately performed, while the cooling processing for the substrate W is performed in the cooling unit CP before the development processing for the substrate W is performed in the processing chamber 31 to 34 in the example described above, the cooling processing for the substrate W does not have to be performed in the cooling unit CP before the development processing.

(6-6) Transportation in Cleaning/Drying Processing Block and Carry-in/Carry-out Block The operation of the cleaning/drying processing block 14A and the carry-in/carry-out block 14B will be described below mainly using FIGS. 13 and 14.

In the cleaning/drying processing block 14A, the main transport mechanism 141 sequentially transports the substrate W after the edge exposure processing among the placement/buffer section P-BF1, the one cleaning/drying processing unit SD1 in the cleaning/drying section 161 and the placement/cooling platform P-CP using the hands H5, H6. Similarly, the main transport mechanism 141 sequentially transports the substrate W among the placement/buffer section P-BF2, the one cleaning/drying processing unit SD1 in the cleaning/drying processing section 161 and the placement/cooling platform P-CP using the hands H5, H6.

Thus, the main transport mechanism 141 alternately transports the substrates W after the edge exposure processing placed on the placement/buffer sections P-BF1, P-BF2 to the placement/cooling platforms P-CP via the cleaning/drying processing section 161 using hands H5, H6. Thus, the substrates W are cleaned and dried, and placed on the placement/cooling platforms P-CP. In the placement/cooling platforms P-CP, the substrates W are cooled to a temperature suitable for the exposure processing in the exposure device 15 (FIG. 9).

The main transport mechanism 142 transports the substrate W after the exposure processing by the exposure device 15 among the substrate platform PASS17, the one cleaning/drying processing unit SD2 in the cleaning/drying processing section 162 and the thermal processing unit PHP in the upper thermal processing section 303 (FIG. 12) using the hands H7, H8. Similarly, the main transport mechanism 142 transports the substrate W after the exposure processing by the exposure device 15 among the substrate platform PASS17, the one cleaning/drying processing unit SD2 in the cleaning/drying processing section 162 and the thermal processing unit PHP in the lower thermal processing section 304 (FIG. 12) using the hands H7, H8.

Thus, the main transport mechanism 142 alternately transports the substrate W after the exposure processing placed on the substrate platform PASS17 using hands H7, H8 to the upper thermal processing section 303 and the lower thermal processing section 304 via the cleaning/drying processing section 162. Thus, the substrate W is cleaned and dried, and the PEB processing is performed in the thermal processing unit PHP in the upper thermal processing section 303 or the lower thermal processing section 304.

In the carry-in/carry-out block 14B, the main transport mechanism 146 takes out the substrate W placed on the placement/cooling platform P-CP using the hand H9, and transports the substrate W to the substrate inlet 15a of the exposure device 15. Further, the main transport mechanism 146 takes out the substrate W after the exposure processing from the substrate outlet 15b of the exposure device 15 using the hand H10, and transports the substrate W to the substrate platform PASS17.

When the exposure device 15 cannot accept the substrate W, the substrate W after the cleaning and drying processing is temporarily stored in the placement/buffer section P-BF1, P-BF2 by the main transport mechanism 141. Further, when the processing chambers 31 to 34 (FIG. 10) in the processing block 13 cannot accept the substrate W after the exposure processing, the substrate W after the PEB processing is temporarily stored in the placement/buffer section P-BF1, P-BF2 by the main transport mechanism 137, 138.

Further, when the substrate W is not normally transported to the placement/buffer sections P-BF1, P-BF2 due to a failure and the like in the processing block 13, the transportation of the substrate W from the placement/buffer sections P-BF1, P-BF2 by the main transport mechanism 141 may be temporarily stopped until the transportation of the substrate W returns to normal.

(7) Effects

In the substrate processing apparatus 100 according to the present embodiment, the resist film formation processing is performed on the substrate W by the processing block 12, and the development processing is performed on another substrate W by the processing block 13. This configuration enables the transportation of the substrate W between the indexer block 11 and the processing block 13 without the use of the main transport mechanism 127, 128 in the processing block 12. Thus, the throughput in the indexer block 11 or the processing block 13 can be prevented from being restricted by the throughput in the processing block 12. Therefore, the throughput of the substrate processing apparatus 100 can be improved.

[3] Third Embodiment (1) Configuration of Substrate Processing Apparatus

Figure 15:
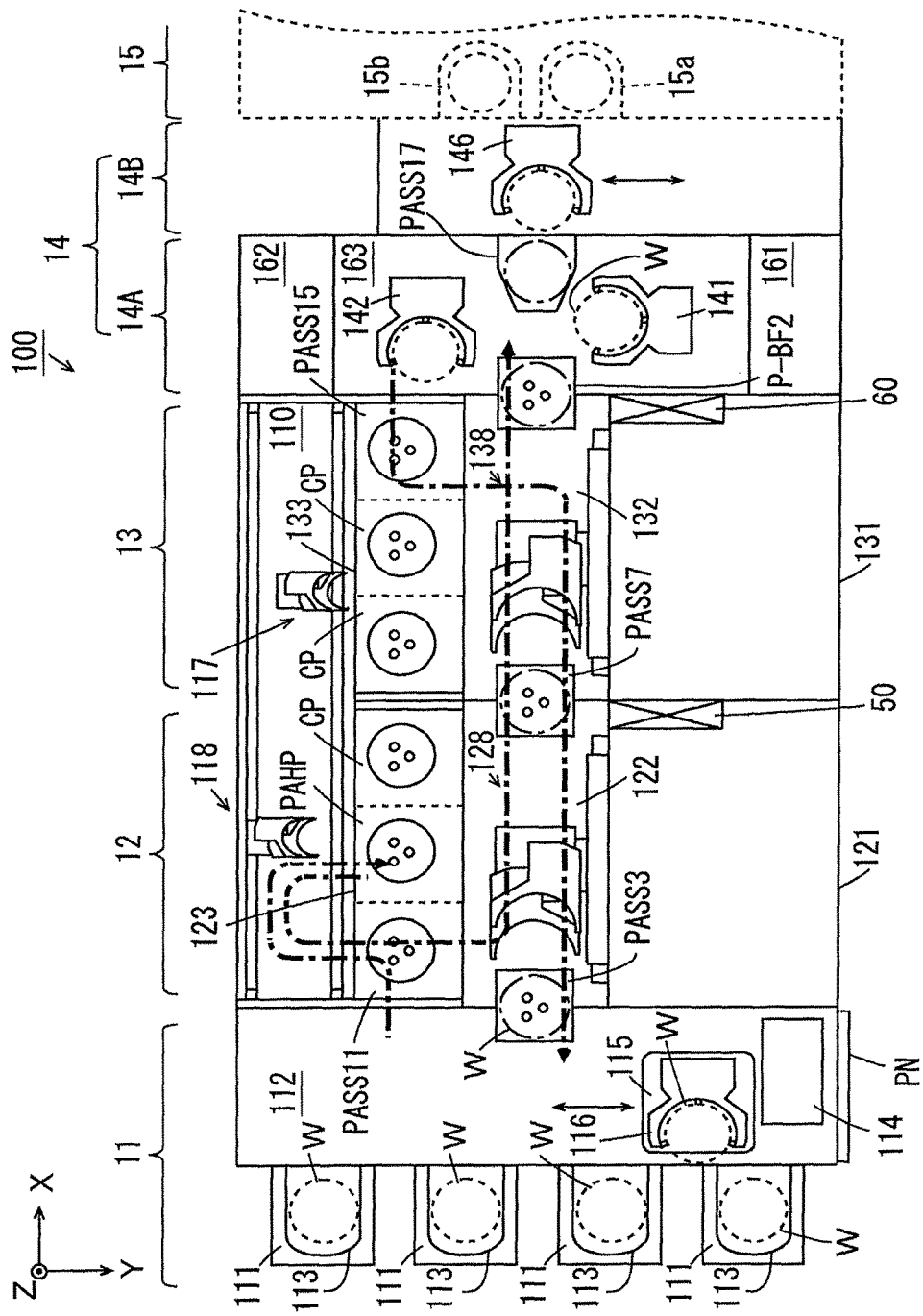
FIG. 15 is a horizontal cross sectional view of the substrate processing apparatus according to a third embodiment.
Figure 16:
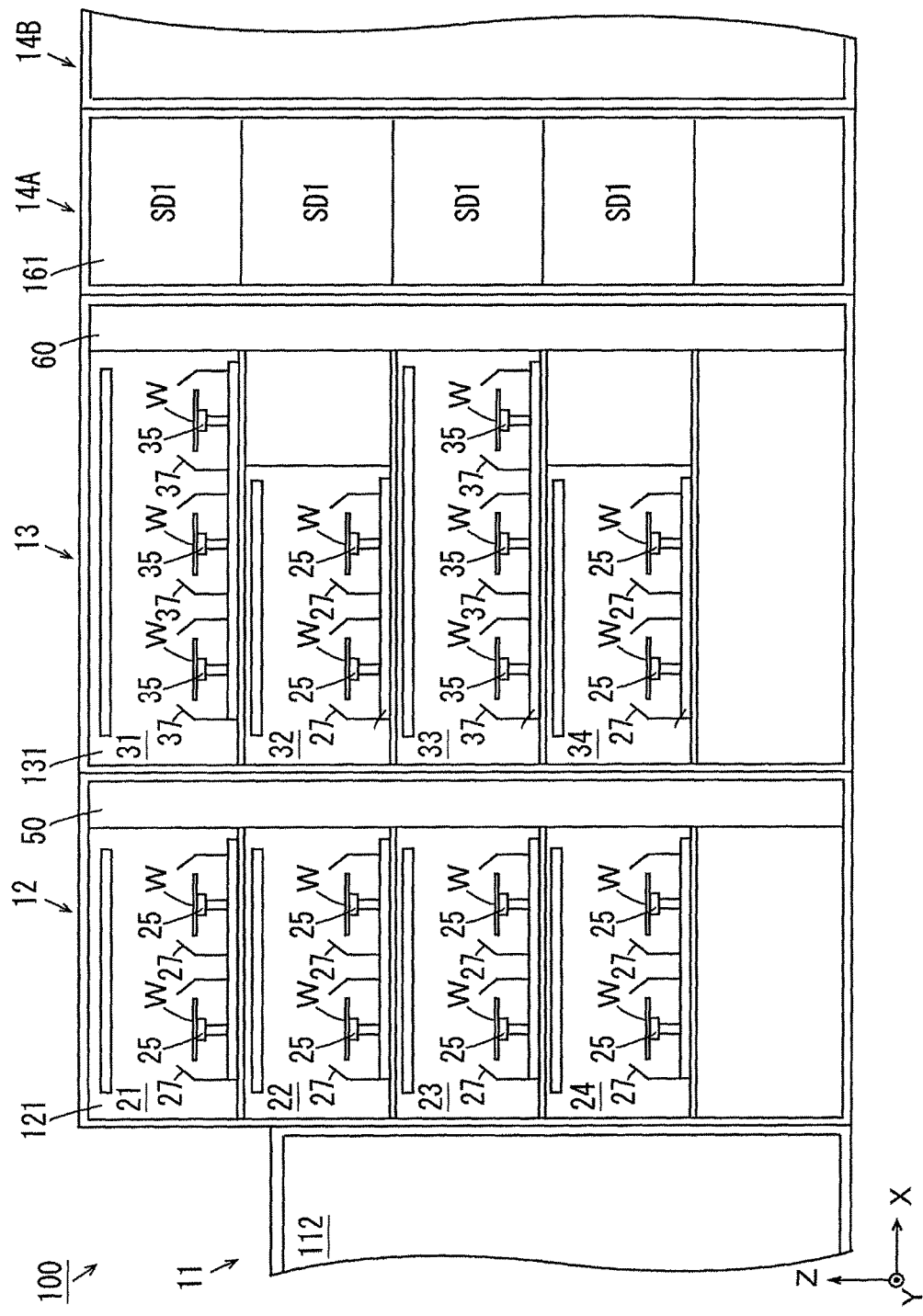
FIG. 16 is a diagram of the first processing section, the second processing section and the cleaning/drying processing section of FIG. 15 as viewed in the −Y direction.
Figure 17:
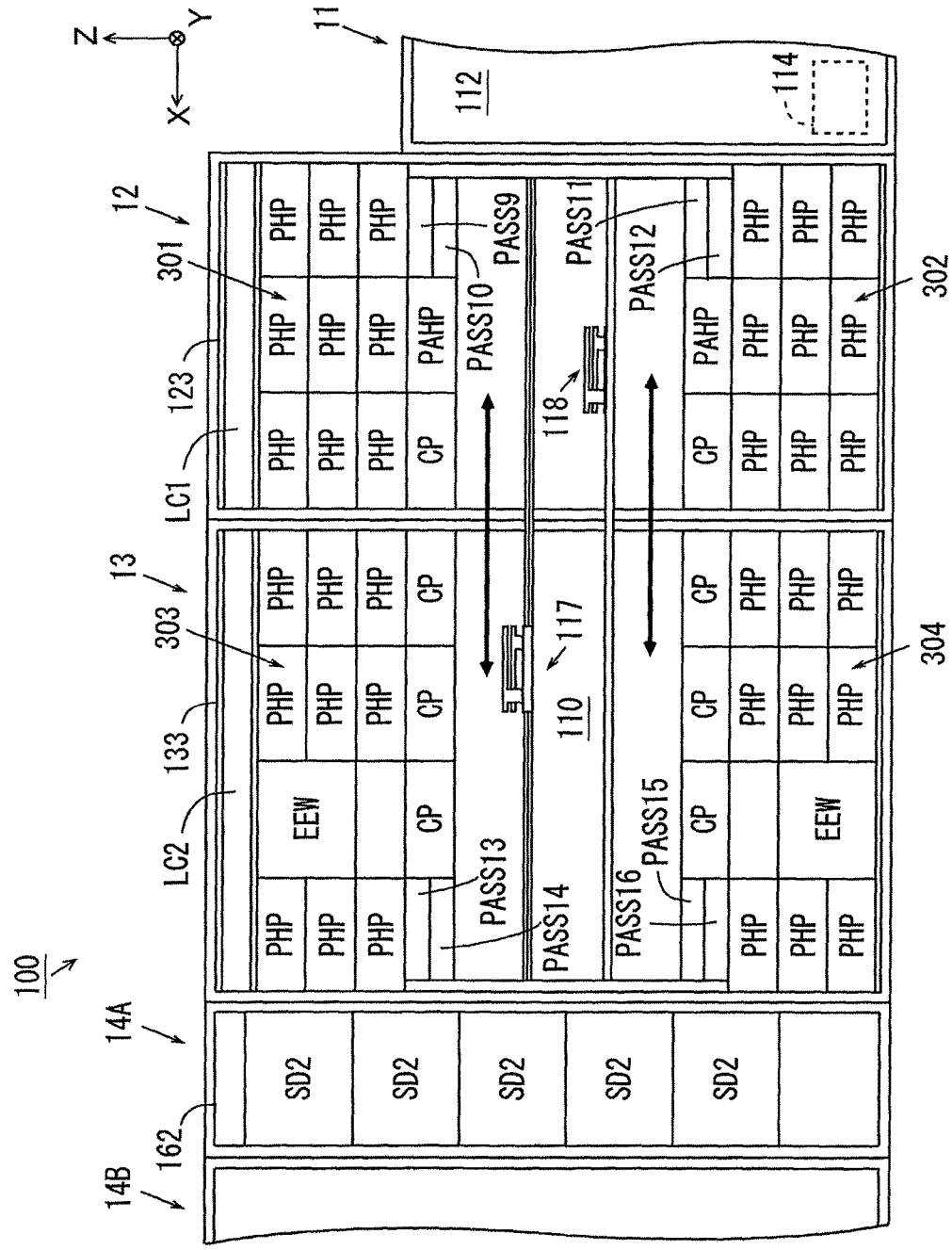
FIG. 17 is a diagram of the thermal processing sections and the cleaning/drying processing section of FIG. 15 as viewed in the +Y direction.

As for the substrate processing apparatus according to the third embodiment, difference from the substrate processing apparatus 100 according to the second embodiment will be described. FIG. 15 is a horizontal cross sectional view of the substrate processing apparatus 100 according to the third embodiment. FIG. 16 is a diagram of the first processing section 121, the second processing section 131 and the cleaning/drying processing section 161 of FIG. 15 as viewed in the −Y direction. FIG. 17 is a diagram of the thermal processing sections 123, 133 and the cleaning/drying processing section 162 of FIG. 15 as viewed in the +Y direction. In the present embodiment, the processing chambers 21 to 24, 32, 34 are the coating processing chambers, and the processing chambers 31, 33 are the development processing chambers.

As shown in FIG. 16, the plurality of spin chucks 25, the plurality of cups 27 and the plurality of processing liquid nozzles (not shown) are provided in each processing chamber 21 to 24, 32, 34. In the present embodiment, the processing liquid nozzles of the processing chambers 22, 24 discharge a processing liquid for the anti-reflection film. The processing liquid nozzles of the processing chambers 21, 23 discharge the processing liquid for the resist film (a resist liquid). The processing liquid nozzles of the processing chambers 32, 34 discharge a processing liquid for the resist cover film.

The plurality of spin chucks 35, the plurality of cups 37 and the plurality of development liquid nozzles (not shown) are provided in each processing chamber 31, 33. In the present embodiment, the two spin chucks 25 and the two cups 27 are provided in each processing chamber 21 to 24, 32, 34. The three spin chucks 35 and the three cups 37 are provided in each processing chamber 31, 33.

As shown in FIG. 17, in the present embodiment, a plurality of adhesion reinforcement processing units PAHP are further provided in the upper thermal processing section 301. Further, a plurality of adhesion reinforcement processing units PAHP are further provided in the lower thermal processing section 302.

In the adhesion reinforcement processing unit PAHP, the adhesion reinforcement processing for improving adhesion between the substrate W and the anti-reflection film is performed. Specifically, in the adhesion reinforcement processing unit PAHP, an adhesion agent such as HMDS (Hexamethyldisilazane) is applied to the substrate W, and the heating processing is performed on the substrate W.

The configuration of the upper thermal processing section 303 in the present embodiment is similar to the configuration of the upper thermal processing section 303 in the second embodiment. Further, the configuration of the lower thermal processing section 304 in the present embodiment is similar to the configuration of the lower thermal processing section 304 in the second embodiment.

(2) One Example of Transportation of Substrate in Substrate Processing Apparatus (2-1) Schematic Operation As shown by the one-dot and dash arrow in FIG. 15, the unprocessed substrate W is transported from the indexer block 11 to the adhesion reinforcement processing unit PAHP in the processing block 12 via the sub-transport chamber 110 in the present example. The substrate W processed by the adhesion reinforcement processing unit PAHP is transported to the transport section 122 in the processing block 12 via the sub-transport chamber 110. The substrate W on which the anti-reflection film and the resist film are formed in the processing block 12 is transported to the transport section 132 in the processing block 13 via the substrate platform PASS5, PASS7. The substrate W on which the resist cover film is formed in the processing block 13 is transported to the interface block 14 via the placement/buffer section P-BF1, P-BF2. The substrate W processed in the interface block 14 is carried into the exposure device 15, and the substrate W after the exposure processing by the exposure device 15 is carried out to the interface block 14.

The substrate W processed in the interface block 14 is transported to the transport section 132 via the thermal processing unit PHP in the upper thermal processing section 303 or the lower thermal processing unit 304 in the processing block 13. The substrate W on which the development processing is performed in the processing block 13 is transported to the indexer block 11 via the substrate platform PASSE, PASSE, the transport section 122 in the processing block 12 and the substrate platform PASS2, PASS4.

In the present example, the substrate W is transported between the main transport mechanism 115 and the sub-transport mechanism 117, 118 via the substrate platform PASS9, PASS11. Thus, even when the time points of transportation of the main transport mechanism 115 and the sub-transport mechanisms 117, 118 are different, the substrate W can be reliably transported between the main transport mechanism 115 and the sub-transport mechanism 117, 118.

Further, the substrate W is transported between the main transport mechanism 127, 128 and the main transport mechanism 137, 138 via the substrate platform PASS5 to PASS8. Thus, even when the time points of transportation of the main transport mechanisms 127, 128 and the main transport mechanisms 137, 138 are different, the substrate W can be reliably transported between the main transport mechanism 127, 128 and the main transport mechanism 137, 138.

Further, the substrate W is transported between the main transport mechanism 127, 128 and the main transport mechanism 115 via the substrate platform PASS2, PASS4. Thus, even when the time points of transportation of the main transport mechanisms 127, 128 and the main transport mechanism 115 are different, the substrate W can be reliably transported between the main transport mechanism 127, 128 and the main transport mechanism 115.

(2-2) Transportation in Indexer Block

The operation of the indexer block 11 will be described below mainly using FIGS. 13, 15 and 17.

The main transport mechanism 115 in the present embodiment takes out the single unprocessed substrate W from the carrier 113 and transports the substrate W to the substrate platform PASS9. Thereafter, the main transport mechanism 115 takes out another single unprocessed substrate W from the carrier 113, and transports the substrate W to the substrate platform PASS11.

When the processed substrate W is placed on the substrate platform PASS2, the main transport mechanism 115 takes out the processed substrate W from the substrate platform PASS2 after transporting the unprocessed substrate W to the substrate platform PASS9. Then, the main transport mechanism 115 transports the processed substrate W to the carrier 113.

Similarly, when the processed substrate W is placed on the substrate platform PASS4, the main transport mechanism 115 takes out the processed substrate W from the substrate platform PASS4 after transporting the unprocessed substrate W to the substrate platform PASS11. Then, the main transport mechanism 115 transports the processed substrate W to the carrier 113.

(2-3) Transportation in Sub-Transport Chamber

Next, one example of the transportation in the sub-transport chamber 110 will be described mainly using FIGS. 15 and 17.

The sub-transport mechanism 117 sequentially transports the unprocessed substrate W among the substrate platform PASS9, the adhesion reinforcement processing unit PAHP and the substrate platform PASS10 using the hands H3, H4. Thus, the adhesion reinforcement processing is performed on the substrate W. Thereafter, the substrate W after the adhesion reinforcement processing is transported to the substrate platform PASS10.

Similarly, the sub-transport mechanism 118 sequentially transports the unprocessed substrate W among the substrate platform PASS11, the adhesion reinforcement processing unit PAHP and the substrate platform PASS12 using the hands H3, H4. Thus, the adhesion reinforcement processing is performed on the substrate W. Thereafter, the substrate W after the adhesion reinforcement processing is transported to the substrate platform PASS12.

(2-4) Transportation in Processing Block 12

The operation of the processing block 12 will be described below mainly using FIGS. 13, 15, 16 and 17.

The main transport mechanism 127 in the upper transport chamber 125 sequentially transports the substrate W after the adhesion reinforcement processing among the substrate platform PASS10, the one cooling unit CP, the processing chamber 22, the one thermal processing unit PHP, another cooling unit CP, the processing chamber 21, another thermal processing unit PHP and the substrate platform PASS5 in the upper thermal processing section 301 using the hands H1, H2. Thus, the cooling processing, the anti-reflection film formation processing, the heating processing and the cooling processing are sequentially performed on the substrate W after the adhesion reinforcement processing. Thereafter, the cooling processing, the resist film formation processing, the heating processing and the cooling processing are sequentially performed on the substrate W. In this manner, the anti-reflection film and the resist film are formed on the substrate W. The substrate W after the resist film formation is transported to the substrate platform PASS5.

Further, the main transport mechanism 127 transports the substrate W after the development processing placed on the substrate platform PASS6 to the substrate platform PASS2 using the hand H1 or the hand H2.

Similarly, the main transport mechanism 128 in the lower transport chamber 126 sequentially transports the substrate W after the adhesion reinforcement processing among the substrate platform PASS11, the one cooling unit CP, the processing chamber 24, the one thermal processing unit PHP, another cooling unit CP, the processing chamber 23, another thermal processing unit PHP and the substrate platform PASS7 in the lower thermal processing section 302 using the hands H1, H2. Thus, the cooling processing, the anti-reflection film formation processing, the heating processing and the cooling processing are sequentially performed on the substrate W after the adhesion reinforcement processing. Thereafter, the cooling processing, the resist film formation processing, the heating processing and the cooling processing are sequentially performed on the substrate W. Thus, the anti-reflection film and the resist film are formed on the substrate W. The substrate W after the resist film formation is transported to the substrate platform PASS7.

Further, the main transport mechanism 128 transports the substrate W after the development processing placed on the substrate platform PASS8 to the substrate platform PASS4 using the hand H1 or the hand H2.

In a case in which the anti-reflection film can be appropriately formed, while the cooling processing for the substrate W is performed in the cooling unit CP before the anti-reflection film formation processing in the processing chamber 22, 24 in the example described above, the cooling processing for the substrate W does not have to be performed in the cooling unit CP for the anti-reflection film formation. Similarly, in a case in which the resist film can be appropriately formed, while the cooling processing for the substrate W is performed in the cooling unit CP before the resist film formation processing in the processing chamber 21, 23, the cooling processing for the substrate W does not have to be performed in the cooling unit CP for the resist film formation.

(2-5) Transportation in Processing Block 13

The operation of the processing block 13 will be described mainly using FIGS. 13, 15, 16 and 17.

The main transport mechanism 137 in the upper transport chamber 135 sequentially transports the substrate W on which the resist film is formed among the substrate platform PASS5, the one cooling unit CP, the processing chamber 32, the one thermal processing unit PHP, the edge exposure unit EEW and the placement/buffer section P-BF1 in the upper thermal processing section 303 using the hands H1, H2. Thus, the cooling processing, the resist cover film formation processing, the heating processing and the cooling processing are sequentially performed on the substrate Won which the resist film is formed. Thereafter, the edge exposure processing is performed on the substrate W, and the substrate W after the edge exposure processing is transported to the placement/buffer section P-BF1.

Further, the main transport mechanism 137 sequentially transports the substrate W after the exposure processing by the exposure device 15 among the one thermal processing unit PHP, the one cooling unit CP, the processing chamber 31, another thermal processing unit PHP and the substrate platform PASS6 in the upper thermal processing section 303 using the hands H1, H2. Thus, the PEB processing, the cooling processing, the development processing and the heating processing are sequentially performed on the substrate W after the exposure processing. The substrate W after the development processing is transported to the substrate platform PASSE.

Similarly, the main transport mechanism 138 in the lower transport chamber 136 sequentially transports the substrate W on which the resist film is formed among the substrate platform PASS7, the one cooling unit CP, the processing chamber 34, the one thermal processing unit PHP, the edge exposure unit EEW and the placement/buffer P-BF2 in the lower thermal processing section 304 using the hands H1, H2. Thus, the cooling processing, the resist cover film formation processing, the heating processing and the cooling processing are sequentially performed on the substrate W on which the resist film is formed. Thereafter, the edge exposure processing is performed on the substrate W, and the substrate W after the edge exposure processing is transported to the placement/buffer section P-BF2.

Further, the main transport mechanism 138 sequentially transports the substrate W after the exposure processing by the exposure device 15 among the one thermal processing unit PHP, the one cooling unit CP, the processing chamber 33, another thermal processing unit PHP and the substrate platform PASS8 in the lower thermal processing section 304 using the hands H1, H2. Thus, the PEB processing, the cooling processing, the development processing and the heating processing are sequentially performed on the substrate W after the exposure processing. The substrate W after the development processing is transported to the substrate platform PASS8.

(2-6) Transportation in Cleaning/Drying Processing Block and Carry-in/Carry-out Block The operation of the cleaning/drying processing block 14A in the present embodiment is similar to the operation of the cleaning/drying processing block 14A in the second embodiment. Further, the operation of the carry-in/carry-out block 14B in the present embodiment is similar to the operation of the carry-in/carry-out block 14B in the second embodiment.

(3) Effects

In the substrate processing apparatus 100 according to the present embodiment, the anti-reflection film formation processing and the resist film formation processing are performed on the substrate W by the processing block 12, and the resist cover film formation processing and the development processing are performed on the substrate W by the processing block 13. This configuration causes the transportation of the substrate W to the adhesion reinforcement processing unit PAHP in the first processing section 121 in the processing block 12 to be performed by the sub-transport mechanisms 117, 118. Therefore, the number of transportation steps by the main transport mechanisms 127, 128 is reduced. Thus, a burden on the main transport mechanisms 127, 128 can be reduced. As a result, throughput of the substrate processing apparatus 100 can be improved.

[4] Other Embodiments (1) The processing block 13 does not have to be provided in the substrate processing apparatus 100 according to the second or the third embodiment. In this case, the indexer block 11 is a first processing region, the processing block 12 is a second processing region and the interface block 14 is a third processing region.

(2) In the substrate processing apparatus 100 according to the first to third embodiments, another processing block may be provided between the indexer block 11 and the processing block 12. In this case, the indexer block 11 is the first processing region, another processing block is the second processing region, the processing block 12 is the third processing region and the processing block 13 is the fourth processing region.

(3) In the substrate processing apparatus 100 according to the first to third embodiments, the carry-in/carry-out sections for the substrates W may be provided at the side surfaces of the cooling units CP in the upper thermal processing section 301 and the lower thermal processing section 302 adjacent to the sub-transport chamber 110. Thus, the sub-transport mechanisms 117, 118 can directly carry in the substrates W from and carry out the substrates W to the cooling units CP. In this case, the cooling units CP can be used as the substrate platforms, so that the substrate platforms PASS9 to PASS12 do not have to be provided.

(4) In the substrate processing apparatus 100 according to the first to third embodiments, the carry-in/carry-out sections for the substrates W may be provided at the side surfaces of the cooling units CP in the upper thermal processing section 303 and the lower thermal processing section 304 adjacent to the sub-transport chamber 110. Thus, the sub-transport mechanisms 117, 118 can directly carry in the substrates W from and carry out the substrates W to the cooling units CP. In this case, the cooling units CP can be used as the substrate platforms, so that the substrate platforms PASS13 to PASS16 do not have to be provided.

(5) In the substrate processing apparatus 100 according to the third embodiment, the carry-in/carry-out sections for the substrates W may be provided at the side surfaces of the adhesion reinforcement processing units PAHP in the upper thermal processing section 303 and the lower thermal processing section 304 adjacent to the transport section 112. Thus, the main transport mechanisms 127, 128 can directly carry in the substrates W from and carry out the substrates W to the adhesion reinforcement processing units PAHP. In this case, the adhesion reinforcement processing units PAHP can be used as the substrate platforms, so that the substrate platforms PASS9 to PASS12 do not have to be provided.

[5] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiment described above, the substrate processing apparatus 100 is an example of a substrate processing apparatus, the indexer block 11 is an example of a first processing region, the processing block 12 is an example of a second processing region, the processing block 13 is an example of a third processing region and the interface block 14 is an example of a fourth processing region. The sub-transport chamber 110 is an example of a sub-transport region, the transport section 122 is an example of a first main transport region, the transport section 132 is an example of a second main transport region and the sub-transport mechanisms 117, 118 are examples of a sub-transport mechanism.

The main transport mechanism 115 is an example of a first main transport mechanism, the main transport mechanisms 127, 128 are examples of a second main transport mechanism, the main transport mechanisms 137, 138 are examples of a third main transport mechanism and the main transport mechanisms 141, 142, 146 are examples of a fourth main transport mechanism. The first processing section 121 and the thermal processing section 123 are examples of a first processing section, the second processing section 131 and the thermal processing section 133 are examples of a second processing section, the spin chuck 25 and the cup 27 are examples of a first liquid processing unit and the spin chuck 35 and the cup 37 are examples of a second liquid processing unit.

The thermal processing unit PHP, the cooling unit CP or the adhesion reinforcement processing unit PAHP are examples of a first thermal processing unit and the thermal processing unit PHP or the cooling unit CP is an example of a second thermal processing unit. The first processing section 121 is an example of a first liquid processing region, the second processing section 131 is an example of a second liquid processing region, the thermal processing section 123 is an example of a first thermal processing region and the thermal processing section 133 is an example of a second thermal processing region.

The upper thermal processing section 301 is an example of a first upper processing section, the lower thermal processing section 302 is an example of a first lower processing section, the upper thermal processing section 303 is an example of a second upper processing section and the lower thermal processing section 304 is an example of a second lower processing section. The main transport mechanism 127 is an example of a first upper main transport mechanism, the main transport mechanism 128 is an example of a first lower main transport mechanism, the main transport mechanism 137 is an example of a second upper main transport mechanism and the main transport mechanism 138 is an example of a second lower main transport mechanism.

The sub-transport mechanism 118 is an example of a first sub-transport mechanism, the sub-transport mechanism 117 is an example of a second sub-transport mechanism, the thermal processing unit PHP, the cooling unit CP or the adhesion reinforcement processing unit PAHP is an example of a processing unit, the carrier 113 is an example of a substrate storage container and the carrier platform 111 is an example of a container platform.

In the substrate processing apparatus 100 according to the first or second embodiment, the substrate platforms PASS9 to PASS12 are examples of a first substrate platform, and the substrate platforms PASS13 to PASS16 are examples of a second substrate platform. In the substrate processing apparatus 100 according to the third embodiment, the substrate platforms PASS9, PASS11 are examples of a first substrate platform, the substrate platforms PASS2, PASS4 are examples of a second substrate platform and the substrate platforms PASS5 to PASS8 are examples of a third substrate platform.

As each of constituent elements recited in the claims, various other elements having configurations or functions described in the claims can be also used.

INDUSTRIAL APPLICABILITY

The present invention can be effectively utilized for various substrate processing.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate processing apparatus comprising:
   first, second and third processing regions arranged to line up in a first direction; and
   a sub-transport region, wherein
   the second processing region is arranged between the first processing region and the third processing region,
   the first processing region includes a first main transport mechanism that transports a substrate,
   the second processing region includes a first processing section that performs processing on the substrate and a second main transport mechanism that transports the substrate, the first processing section and the second main transport mechanism being arranged to line up in a second direction that intersects with the first direction,
   the first processing section includes a plurality of first processing units,
   the third processing region includes a third main transport mechanism that transports the substrate,
   the sub-transport region includes a sub-transport mechanism that transports the substrate,
   the sub-transport mechanism is configured to transport the substrate between the first main transport mechanism and at least one first processing unit of the plurality of first processing units,
   the second main transport mechanism is configured to carry in the substrate from and carry out the substrate to another first processing unit of the plurality of first processing units, to receive the substrate from and transfer the substrate to the first main transport mechanism and to receive the substrate from and transfer the substrate to the third main transport mechanism, and
   with respect to said second direction, the sub-transport region is provided completely within a footprint of the first processing section when viewed from above in a vertical direction that intersects with the first and second directions.

2. The substrate processing apparatus according to claim 1, further comprising:
   a first substrate platform, wherein
   the first main transport mechanism is configured to transport the substrate to the sub-transport mechanism by placing the substrate on the first substrate platform, and
   the sub-transport mechanism is configured to transport the substrate to the second main transport mechanism by placing the substrate on the first substrate platform.

3. The substrate processing apparatus according to claim 2, wherein
   the plurality of first processing units include a liquid processing unit that performs processing using a processing liquid and a thermal processing unit that performs thermal processing on the substrate,
   the at least one first processing unit includes the thermal processing unit,
   the second processing region includes a liquid processing region in which the liquid processing unit is arranged, a thermal processing region in which the thermal processing unit is arranged and a main transport region in which the second main transport mechanism is arranged,
   the main transport region is arranged between the liquid processing region and the thermal processing region,
   the sub-transport region is provided on an opposite side to the main transport region with respect to the thermal processing region, and
   the first substrate platform is arranged between the main transport region and the sub-transport region.

4. The substrate processing apparatus according to claim 1, further comprising:
   a second substrate platform, and
   a third substrate platform, wherein
   the second main transport mechanism is configured to transport the substrate to the first main transport mechanism by placing the substrate on the second substrate platform, and is configured to transport the substrate to the third main transport mechanism by placing the substrate on the third substrate platform, and the third main transport mechanism is configured to transport the substrate to the second main transport mechanism by placing the substrate on the third substrate platform.

5. The substrate processing apparatus according to claim 1, wherein the first processing region further includes a container platform on which a substrate storing container that stores the substrate is placed, and the first main transport mechanism is configured to transport the substrate between the substrate storing container placed on the container platform and the second main transport mechanism and to transport the substrate between the substrate storing container placed on the container platform and the sub-transport mechanism.

6. The substrate processing apparatus according to claim 1, further comprising:

a fourth processing region arranged to be adjacent to the third processing region, wherein the fourth processing region includes a fourth main transport mechanism that transports the substrate, the third processing region further includes a second processing section that performs processing on the substrate, and the third main transport mechanism is configured to transport the substrate among the sub-transport mechanism, the second processing section and the fourth main transport mechanism.

7. The substrate processing apparatus according to claim 6, wherein, the second processing section includes a plurality of second processing units, the sub-transport mechanism receives the substrate from and transfers the substrate to at least one second processing unit of the plurality of second processing units, and the third main transport mechanism is configured to receive the substrate from and transfer the substrate to another second processing unit of the plurality of second processing units.

* * * * *